(12) United States Patent
Ohtomo

(10) Patent No.: US 6,346,727 B1
(45) Date of Patent: Feb. 12, 2002

(54) SEMICONDUCTOR DEVICE HAVING OPTIMIZED TWO-DIMENSIONAL ARRAY OF DOUBLE DIFFUSED MOS FIELD EFFECT TRANSISTORS

(75) Inventor: Takahiro Ohtomo, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/226,110

(22) Filed: Jan. 7, 1999

(30) Foreign Application Priority Data

Jan. 7, 1998 (JP) .......................................... 10-001873

(51) Int. Cl.$^7$ .............................................. H01L 29/76
(52) U.S. Cl. ........................ 257/341; 257/342; 257/413
(58) Field of Search ................................. 257/341, 342, 257/413

(56) References Cited

U.S. PATENT DOCUMENTS 5,757,046 A * 5/1998 Fujihira et al. ............. 257/341

FOREIGN PATENT DOCUMENTS

| JP | 1-238173 | 9/1989 |
| JP | 5-235362 | 9/1993 |
| JP | 6-275838 | 9/1994 |
| JP | 6-342915 | 12/1994 |

* cited by examiner

*Primary Examiner*—Mark V. Prenty
(74) *Attorney, Agent, or Firm*—Young & Thompson

(57) ABSTRACT

A semiconductor device having a plurality of double diffused field effect transistor cells so aligned in two-dimension that each of at least a majority of the double diffused field effect transistor cells has plural sides bounded with plural channel regions and plural corners free of any bound with the plural channel regions.

10 Claims, 27 Drawing Sheets

SEMICONDUCTOR DEVICE HAVING OPTIMIZED TWO-DIMENSIONAL ARRAY OF DOUBLE DIFFUSED MOS FIELD EFFECT TRANSISTORS

BACKGROUND OF THE INVENTION

The present invention relates to a semiconductor device, and more particularly to a semiconductor device having optimized two-dimensional arrays of double diffused MOS field effect transistor cells having a reduced ON-resistance between source and drain, a reduced threshold voltage and an increased source-drain withstand voltage as well as a method of optimization of two-dimensional arrays of double diffused MOS field effect transistor cells for obtaining possible reductions in channel resistance and threshold voltage of the double diffused MOS field effect transistor cells.

FIGS. 1A through 1G are fragmentary cross sectional elevation views illustrative of a method of forming a double diffused MOS field effect transistor over a semiconductor substrate.

With reference to FIG. 1A, a gate oxide film 2 having a thickness of 20–200 nanometers is formed on an n-type semiconductor substrate With reference to FIG. 1B, a gate polysilicon layer 3 is deposited on the gate oxide film 2 by a chemical vapor deposition method so that the gate polysilicon layer 3 has a thickness of 300–600 nanometers. The gate polysilicon layer 3 is then doped with phosphorus to reduce a resistivity thereof.

With reference to FIG. 1C, the phosphorus-doped gate polysilicon layer 3 and the gate oxide film 2 are patterned by a photolithography technique, thereby to form a gate electrode 3 so that a predetermined region of the n-type semiconductor substrate 1 is shown.

With reference to FIG. 1D, an p-type impurity is ion-implanted into the predetermined region of the n-type semiconductor substrate 1 so that a p-type base region 4 is selectively formed in an upper region of the n-type semiconductor substrate 1.

With reference to FIG. 1E, an n-type impurity is selectively ion-implanted into selected regions of the p-type base region 4 so that n+-type source regions 5 are selectively formed in selected upper regions of the p-type base region 4.

With reference to FIG. 1F, an inter-layer insulator 6 having a thickness of 300–1500 nanometers is entirely formed over the gate electrode 3, the n+-type source regions 5 and the p-type base region 4. A contact hole is formed in the inter-layer insulator 6 so that the contact hole is positioned over inside half of each of the n+-type source regions 5 and the p-type base region 4.

With reference to FIG. 1G, an aluminum electrode 7 having a thickness of 1–3 micrometers is entirely deposited over the inter-layer insulator 6, the over inside half of each of the n+-type source regions 5 and the p-type base region 4, so that the aluminum electrode layer 7 is made into contact with the n+-type source regions 5. A drain electrode 8 is formed on a bottom surface of the n-type semiconductor substrate 1.

FIG. 2A is a fragmentary plane view illustrative of a first conventional two-dimensional array of a plurality of double diffused MOS field effect transistors over a semiconductor substrate. FIG. 2B is a fragmentary cross sectional elevation view illustrative of a semiconductor device having the first conventional two-dimensional array of a plurality of double diffused MOS field effect transistors, taken along an A–A' line of FIG. 2A With reference to FIG. 2A, a plurality of square-shaped double diffused MOS field effect transistor cells are aligned in matrix, wherein the shape of each of the square-shaped double diffused MOS field effect transistor cells is defined by a boundary line between outside edges of the source region 5 and channel regions 14. Each of the square-shaped double diffused MOS field effect transistor cells is surrounded by a square-frame shaped channel region 14. A square-shaped boundary broken line 9 corresponds to the outside edge of the square-frame shaped channel region 14 or the outside edge of the base region 4. Adjacent two of the square-shaped double diffused MOS field effect transistor cells are distanced from each other.

With reference to FIG. 2B, the p-type base regions 4 are selectively formed in selected upper regions of the n-type semiconductor substrate 1. The n+-type source regions 5 are selectively formed in selected upper regions of the p-type base regions 4. Each of the square-frame shaped channel regions 14 is defined between the outside edges of the n+-type source regions 5 and the outside edge of the p-type base region 4. The gate oxide film 2 is selectively formed on the n-type semiconductor substrate 1 and on the square-frame shaped channel regions 14. The phosphorus doped polysilicon gate electrode 3 is provided on the gate oxide film 2. The inter-layer insulator 6 is provided, which covers the phosphorus doped polysilicon gate electrode 3 and the outside half regions of the n+-type source regions 5. The aluminum electrode layer 7 is provided which entirely extends over the inter-layer insulator 6 and inside half regions of the n+-type source regions 5. The drain electrode 8 is provided on the bottom surface of the n-type semiconductor substrate 1.

FIG. 3A is a fragmentary plane view illustrative of a second conventional two-dimensional array of a plurality of double diffused MOS field effect transistors over a semiconductor substrate. FIG. 3B is a fragmentary cross sectional elevation view illustrative of a semiconductor device having the second conventional two-dimensional array of a plurality of double diffused MOS field effect transistors, taken along an A–A' line of FIG. 3A.

With reference to FIG. 3A, a plurality of circular-shaped double diffused MOS field effect transistor cells are aligned in two dimensional staggered alignment, wherein the shape of each of the circular-shaped double diffused MOS field effect transistor cells is defined by a boundary circular line between outside edges of the annular-shaped source region 5 and circular-frame shaped channel regions 14. Each of the circular-shaped double diffused MOS field effect transistor cells is surrounded by the circular-frame shaped channel region 14. A circular-shaped boundary broken line 9 corresponds to the outside edge of the circular-frame shaped channel region 14 or the outside edge of the base region 4. Adjacent two of the circular-shaped double diffused MOS field effect transistor cells are distanced from each other.

With reference to FIG. 3B, the p-type base regions 4 are selectively formed in selected upper regions of the n-type semiconductor substrate 1. The n+-type source regions 5 are selectively formed in selected upper regions of the p-type base regions 4. Each of the circular-frame shaped channel regions 14 is defined between the outside edges of the n+-type source regions 5 and the outside edge of the p-type base region 4. The gate oxide film 2 is selectively formed on the n-type semiconductor substrate 1 and on the circular-frame shaped channel regions 14. The phosphorus doped polysilicon gate electrode 3 is provided on the gate oxide film 2. The inter-layer insulator 6 is provided, which covers the phosphorus doped polysilicon gate electrode 3 and the outside half regions of the n+-type source regions 5. The aluminum electrode layer 7 is provided which entirely extends over the inter-layer insulator 6 and inside half regions of the n+-type source regions 5. The drain electrode 8 is provided on the bottom surface of the n-type semiconductor substrate 1.

FIG. 4A is a fragmentary plane view illustrative of a third conventional two-dimensional array of a plurality of double diffused MOS field effect transistors over a semiconductor substrate. FIG. 4B is a fragmentary cross sectional elevation view illustrative of a semiconductor device having the third conventional two-dimensional array of a plurality of double diffused MOS field effect transistors, taken along an A–A' line of FIG. 4A. FIG. 4C is a fragmentary cross sectional elevation view illustrative of a semiconductor device having the third conventional two-dimensional array of a plurality of double diffused MOS field effect transistors, taken along a B–B' line of FIG. 4A.

With reference to FIG. 4A, a plurality of modified band shaped double diffused MOS field effect transistor cells extend in parallel to each other in a diagonal direction, wherein each of the modified band shaped double diffused MOS field effect transistor cells comprises a plurality of square-shaped expanding portions which are distanced from each other at a constant pitch and diagonally extending straight band portions connecting the adjacent two of the square-shaped expanding portions. The square-shaped expanding portions of the modified band shaped double diffused MOS field effect transistor cells are aligned in matrix. In view of the diagonal direction along the diagonally extending straight band portions of the modified band shaped double diffused MOS field effect transistor cells, however, the square-shaped expanding portions of the modified band shaped double diffused MOS field effect transistor cells show a staggered alignment. The shape of each of the modified band shaped double diffused MOS field effect transistor cells is defined by boundary lines between outside edges of the source region 5 and channel regions 14. Each of the modified band shaped double diffused MOS field effect transistor cells is surrounded by a modified-line shaped channel region 14. A modified-line boundary broken line 9 corresponds to the outside edge of the modified-line shaped channel region 14 or the outside edge of the base region 4. Adjacent two of the modified band shaped double diffused MOS field effect transistor cells are distanced from each other in another diagonal direction vertical to the above diagonal direction along which the modified band shaped double diffused MOS field effect transistor cells extend.

With reference to FIG. 4B, the p-type base region 4 is selectively formed in a selected upper region of the n-type semiconductor substrate 1. The n+-type source regions 5 are selectively formed in selected upper regions of the p-type base regions 4. Each of the square-fame shaped channel regions 14 is defined between the outside edges of the n+-type source regions 5 and the outside edge of the p-type base region 4. The gate oxide film 2 is selectively formed on the n-type semiconductor substrate 1 and on the square-frame shaped channel regions 14. The phosphorus doped polysilicon gate electrode 3 is provided on the gate oxide film 2. The inter-layer insulator 6 is provided, which covers the phosphorus doped polysilicon gate electrode 3 and the outside half regions of the n+-type source regions 5. The aluminum electrode layer 7 is provided which entirely extends over the inter-layer insulator 6 and inside half regions of the n+-type source regions 5. The drain electrode 8 is provided on the bottom surface of the n-type semiconductor substrate 1.

With reference to FIG. 4C, the p-type base region 4 is selectively formed in a selected upper region of the n-type semiconductor substrate 1. The n+-type source region 5 is selectively formed in selected upper regions of the p-type base regions 4. Each of the square-frame shaped channel regions 14 is defined between the outside edges of the n+-type source region 5 and the outside edge of the p-type base region 4. The gate oxide film 2 is selectively formed on the n-type semiconductor substrate 1 and on the square-frame shaped channel regions 14. The phosphorus doped polysilicon gate electrode 3 is provided on the gate oxide film 2. The inter-layer insulator 6 is provided, which covers the phosphorus doped polysilicon gate electrode 3 and the outside half regions of the n+-type source region 5. The aluminum electrode layer 7 is provided which entirely extends over the inter-layer insulator 6 and an inside half region of the n+-type source region 5. The drain electrode 8 is provided on the bottom surface of the n-type semiconductor substrate 1.

The most important properties of the double diffused MOS field effect transistor are a possible reduced ON-resistance, a possible reduced threshold voltage and a possible increased source-drain withstand voltage. The ON-resistance is given by the sum of a channel resistance and a bulk resistance. FIG. 5 is a diagram illustrative of variations in ratio of a channel resistance to an ON-resistance over a source-drain withstand voltage of the double diffused MOS field effect transistor. The ratio of the channel resistance to the ON-resistance is simply decreased by increasing the source-drain withstand voltage of the double diffused MOS field effect transistor. In the low channel resistance region, the channel resistance is more dominative than the bulk resistance. In the low channel resistance region, therefore, it is more important how to reduce the channel resistance as many as possible in order to reduce the ON-resistance. The channel resistance of the double diffused MOS field effect transistor is given by the following equation.

$$Rch = 1/\{(W/L)C_0\mu(V_{GS} - V_{th})\}$$
$$= a/W$$
$$= 1/\{b(V_{GS} - V_{th})\}$$

where Rch is the channel resistance of the double diffused MOS field effect transistor, W is the channel width of the channel region, L is the channel length of the channel region, $C_0$ is the capacity of the gate oxide film, $\mu$ is the majority carrier mobility, $V_{GS}$ is the gate-source voltage, $V_{th}$ is the threshold voltage, and "a" and "b" are constants.

The above equation shows that the channel resistance of the double diffused MOS field effect transistor is inversely proportional to the channel width of the channel region. This means that in order to reduce the channel resistance, it is required to increase the channel width.

The above equation also shows that the channel resistance of the double diffused MOS field effect transistor is decreased by decreasing the threshold voltage of the double diffused MOS field effect transistor. This means that in order to reduce the channel resistance, it is required to decrease the threshold voltage of the double diffused MOS field effect transistor.

The threshold voltage of the double diffused MOS field effect transistor is further given by the following equation.

$$Vth = V_{FB} + 2\phi F_P + \sqrt{\{2Ks\varepsilon_0 qN_A(2\phi F_P)\}}$$
$$= \left(\sqrt{N_A}\right)/C$$

where Vth is the threshold voltage of the double diffused MOS field effect transistor, $V_{FB}$ is the flat band potential, $\phi$ is the electrostatic potential, $F_P$ is the flux of holes, $K_S$ is the dielectric constant of silicon, $\varepsilon_0$ the dielectric constant in vacuum, q is the charge of electron, $N_A$ is the acceptor or donor concentration of the channel region, and "c" is the constant.

The above equation shows that the threshold voltage of the double diffused MOS field effect transistor is decreased by decreasing the acceptor or donor concentration of the channel region. Since the channel regions are formed in the base region, the acceptor or donor concentration of the channel region is equal to the acceptor or donor concentration of the base region.

Consequently, the decrease in the acceptor or donor concentration of the base region results in the decreases in threshold voltage and ON-resistance of the double diffused MOS field effect transistor. The increase in the acceptor or donor concentration of the base region results in the increases in threshold voltage and ON-resistance of the double diffused MOS field effect transistor. In order to realize possible reductions in threshold voltage and ON-resistance of the double diffused MOS field effect transistor, it is required to reduce the acceptor or donor concentration of the base region. Notwithstanding, an excessive reduction in the acceptor or donor concentration of the base region makes a space charge region easy to expend in the base region so that a punch through phenomenon may be caused, thereby dropping the source-drain withstand voltage.

The above first to third conventional two-dimensional arrays of the plurality of double diffused MOS field effect transistors are engaged with the following problems.

The first conventional two-dimensional array of a plurality of double diffused MOS field effect transistors illustrated in FIG. 2A has the following disadvantages. The square-shaped double diffused MOS field effect transistor cells are aligned in matrix so that adjacent two of the square-shaped double diffused MOS field effect transistor cells are distanced from each other, for which reason a density of the square-shaped double diffused MOS field effect transistor cells is low. This low density of the square-shaped double diffused MOS field effect transistor cells means that it is difficult to increase a total width of the channel widths of the channel regions in a unit area of the semiconductor substrate. FIG. 6 is a partial enlarged plane view illustrative of a corner of the square-shaped double diffused MOS field effect transistor cell, where the acceptor concentration of the p-type base region in the vicinity of the corner of the square-shaped double diffused MOS field effect transistor cell is lower than the other portions of the p-type base region. The lower acceptor concentration of the p-type base region in the vicinity of the corner of the square-shaped double diffused MOS field effect transistor cell makes the punch through phenomenon likely to appear, whereby the source-drain withstand voltage is dropped. Even if the acceptor concentration of the base region is increased in order to prevent the drop of the source-drain withstand voltage or appearance of the punch through phenomenon, then the increase in the acceptor concentration of the base region makes it difficult to reduce the threshold voltage, whereby the difficulty in reduction of the threshold voltage makes it difficult to reduce the ON-resistance of the double diffused MOS field effect transistor.

The second conventional two-dimensional array of a plurality of double diffused MOS field effect transistors illustrated in FIG. 3A has the following disadvantages. The circular-shaped double diffused MOS field effect transistor cells are aligned in two-dimensional staggered alignment, so that adjacent two of the circular-shaped double diffused MOS field effect transistor cells are distanced from each other. Notwithstanding, the two-dimensional staggered alignment may increase the density of the circular-shaped double diffused MOS field effect transistor cells. However, the circular-shape of the circular-shaped double diffused MOS field effect transistor cells shortens a individual channel width of each of the circular-shaped double diffused MOS field effect transistor cells as compared to the square-shape of the square-shaped double diffused MOS field effect transistor cells. This circular-shape of the circular-shaped double diffused MOS field effect transistor cells makes it difficult to increase a total width of the channel widths of the channel regions in a unit area of the semiconductor substrate. The difficulty in increase in the total width of the channel widths of the channel regions of the circular-shaped double diffused MOS field effect transistors makes it difficult to reduce the channel resistance of the circular-shaped double diffused MOS field effect transistors. The difficulty in reduction of the channel resistance of the circular-shaped double diffused MOS field effect transistors means it difficult to reduce the ON-resistance of the double diffused MOS field effect transistor.

The third conventional two-dimensional array of a plurality of double diffused MOS field effect transistors illustrated in FIG. 4A has the following disadvantages. The modified band shaped double diffused MOS field effect transistor cells are aligned in parallel to each other so that adjacent two of the modified band shaped double diffused MOS field effect transistor cells are distanced from each other, for which reason a density of the modified band shaped double diffused MOS field effect transistor cells is low. However, each of the modified band shaped double diffused MOS field effect transistor cells has wide channel width. This makes it easy to increase the total width of the channel regions of the modified band shaped double diffused MOS field effect transistor cells. Notwithstanding, each of the modified band shaped double diffused MOS field effect transistor cells comprises a plurality of the square-shaped expanding portions which are distanced from each other at a constant pitch and the diagonally extending straight band portions connecting the adjacent two of the square-shaped expanding portions. Namely, each of the square-shaped expanding portions of each of the modified band shaped double diffused MOS field effect transistor cells has two corners, where the acceptor concentration of the p-type base region in the vicinity of the corner of the square-shaped expanding portions of the modified band shaped double diffused MOS field effect transistor cell is lower than the other portions of the p-type base region. The lower acceptor concentration of the p-type base region in the vicinity of the corner of the square-shaped expanding portions of the modified band shaped double diffused MOS field effect transistor cell makes the punch through phenomenon likely to appear, whereby the source-drain withstand voltage is dropped. Even if the acceptor concentration of the base region is increased in order to prevent the drop of the source-drain withstand voltage or appearance of the punch through phenomenon, then the increase in the acceptor concentration of the base region makes it difficult to reduce the threshold voltage, whereby the difficulty in reduction of the threshold voltage makes it difficult to reduce the ON-resistance of the double diffused MOS field effect transistor. The above third conventional two-dimensional array of a plurality of double diffused MOS field effect transistors illustrated in FIG. 4A has a further disadvantage as follows. FIG. 7A is a schematic view illustrative of a parasitic transistor as formed at a center portion of the square-shaped expanding portion of the modified band shaped double diffused MOS field effect transistor cell in FIG. 4B. In order to inactivate the parasitic bipolar transistor, a short circuit is formed between the source region 5 and the base region 4. FIG. 7B is a schematic view illustrative of a parasitic transistor as formed at a center portion of the diagonally extending straight band portion of the modified band shaped double diffused MOS field effect transistor cell in FIG. 4C. Since the diagonally extending straight band portion of the modified band shaped double diffused MOS field effect transistor cell is slender, it is difficult to form any short circuit between the source region 5 and the base region 4, for which reason the parasitic bipolar transistor is allowed to be activated.

In the above circumstances, it had been required to develop a novel two-dimensional array of the double diffused MOS field effect transistor cells free from the above problems and disadvantages.

SUMMARY OF THE INVENTION

Accordingly, it is an object of the present invention to provide a novel semiconductor device having optimized two-dimensional arrays of double diffused MOS field effect transistor cells free from the above problems.

It is a further object of the present invention to provide a novel semiconductor device having optimized two-dimensional arrays of double diffused MOS field effect transistor cells having a reduced ON-resistance between source and drain.

It is a still further object of the present invention to provide a novel semiconductor device having optimized two-dimensional arrays of double diffused MOS field effect transistor cells having a reduced threshold voltage.

It is yet a further object of the present invention to provide a novel semiconductor device having optimized two-dimensional arrays of double diffused MOS field effect transistor cells having an increased source-drain withstand voltage.

It is a further more object of the present invention to provide a novel semiconductor device having optimized two-dimensional arrays of double diffused MOS field effect transistor cells free from any parasitic transistor.

The first present invention provides a semiconductor device having a plurality of double diffused field effect transistor cells so aligned in two-dimension that each of at least a majority of the double diffused field effect transistor cells has plural sides bounded with plural channel regions and plural corners free of any bound with the plural channel regions. The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
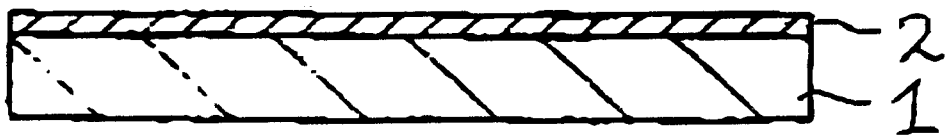
FIGS. 1A through 1G are fragmentary cross sectional elevation views illustrative of a method of forming a double diffused MOS field effect transistor over a semiconductor substrate.
Figure 1B:
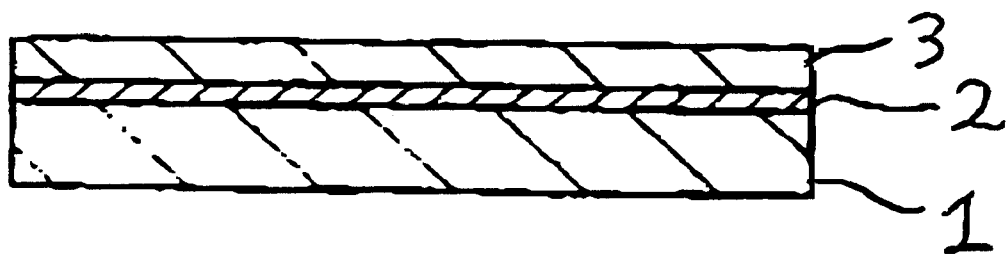
Figure 1C:
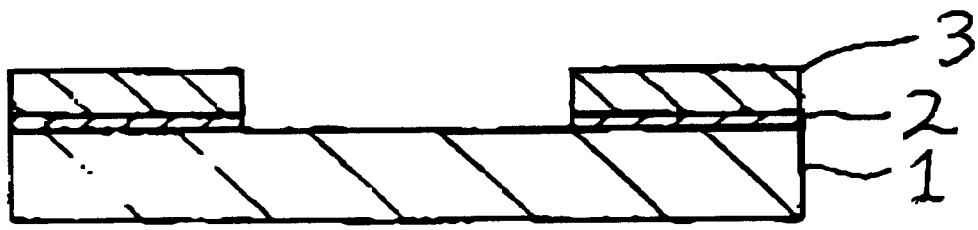
Figure 1D:
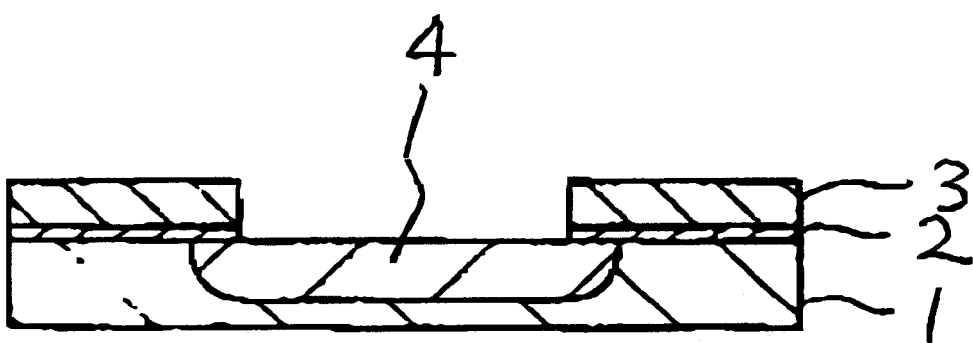
Figure 1E:
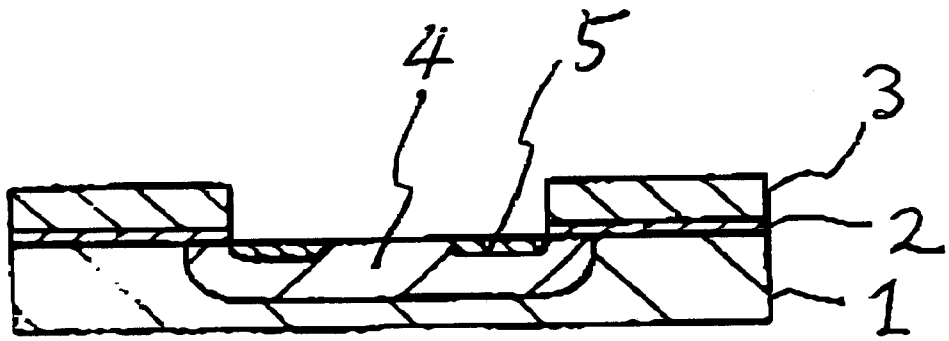
Figure 1F:
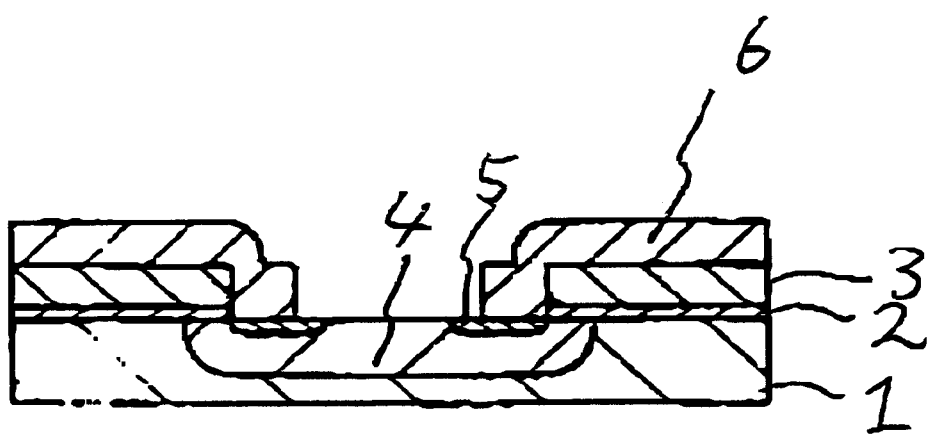
Figure 1G:
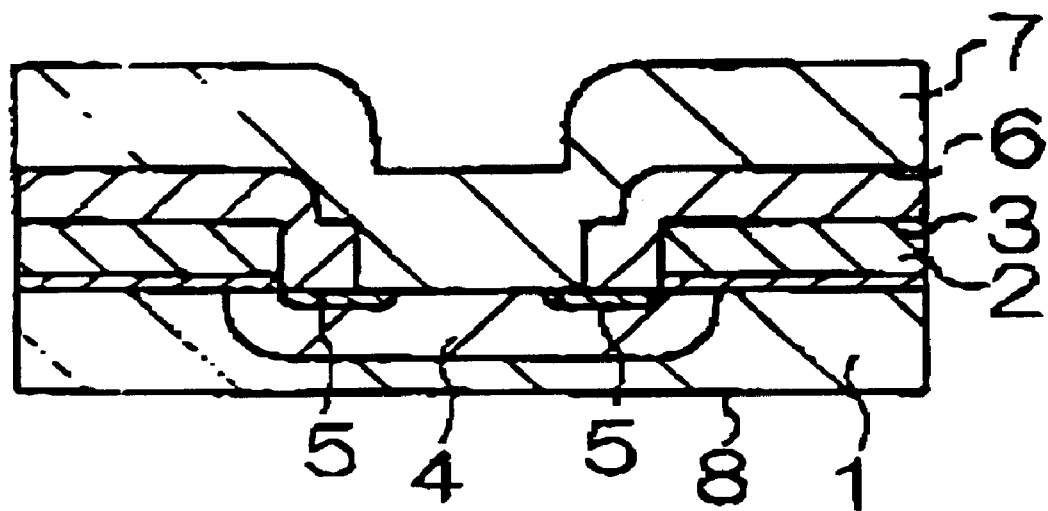
Figure 2A:
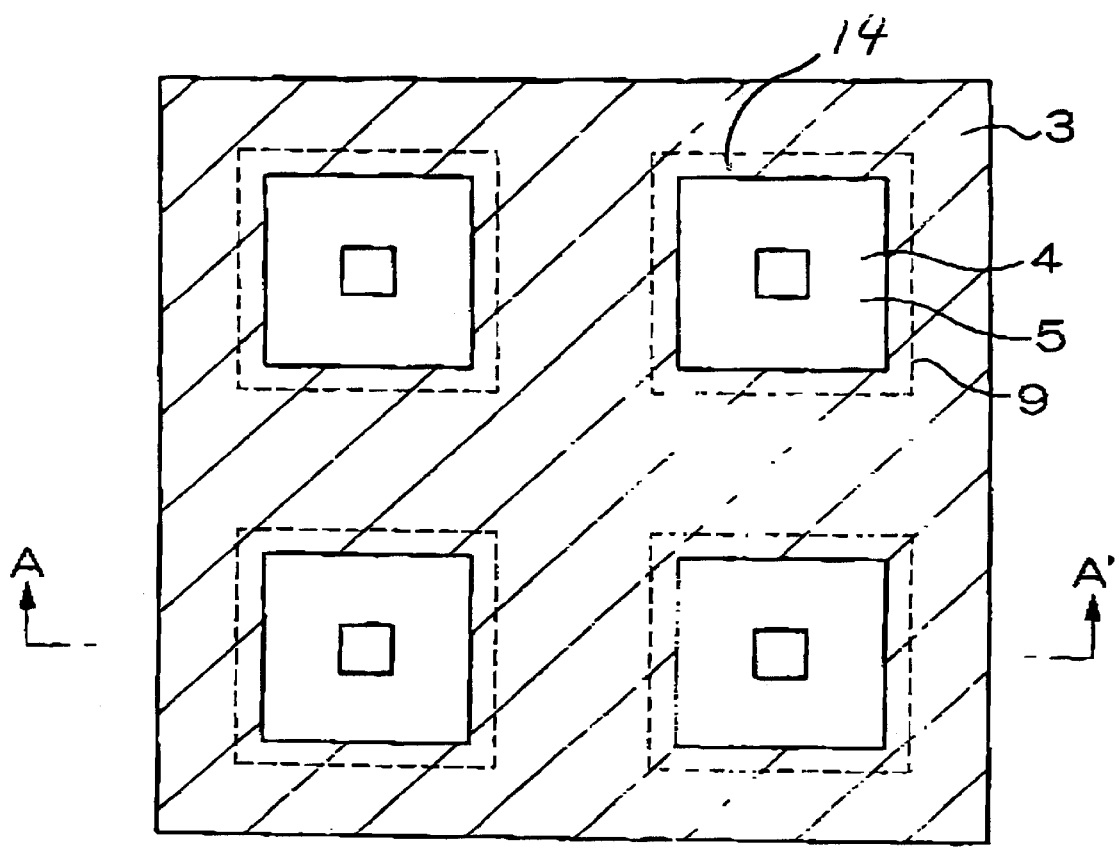
FIG. 2A is a fragmentary plane view illustrative of a first conventional two-dimensional array of a plurality of double diffused MOS field effect transistors over a semiconductor substrate.
Figure 2B:
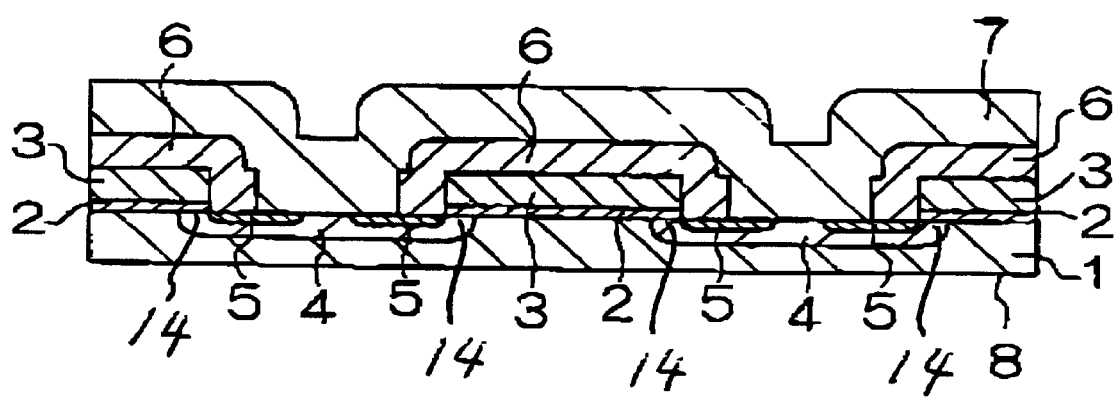
FIG. 2B is a fragmentary cross sectional elevation view illustrative of a semiconductor device having the first conventional two-dimensional array of a plurality of double diffused MOS field effect transistors, taken along an A–A' line of FIG. 2A.
Figure 3A:
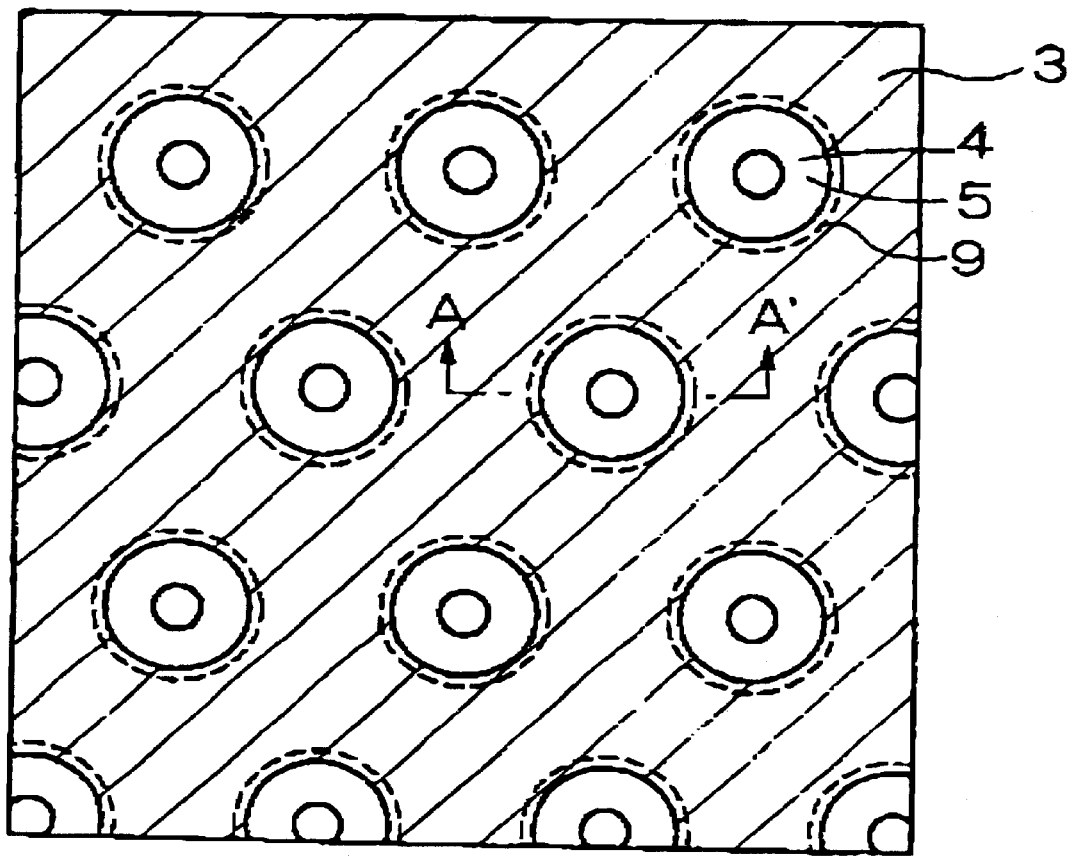
FIG. 3A is a fragmentary plane view illustrative of a second conventional two-dimensional array of a plurality of double diffused MOS field effect transistors over a semiconductor substrate.
Figure 3B:
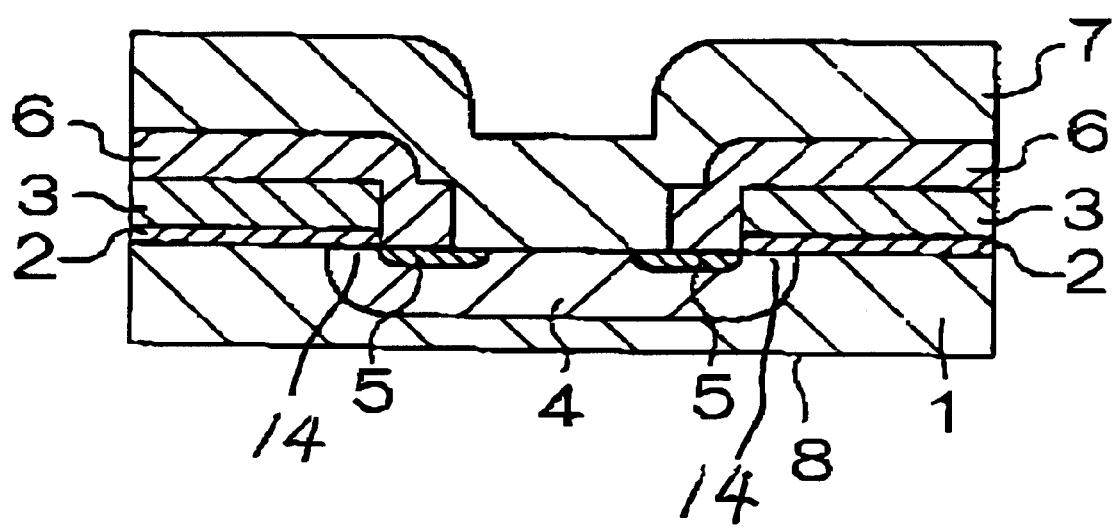
FIG. 3B is a fragmentary cross sectional elevation view illustrative of a semiconductor device having the second conventional two-dimensional array of a plurality of double diffused MOS field effect transistors, taken along an A–A' line of FIG. 3A.
Figure 4A:
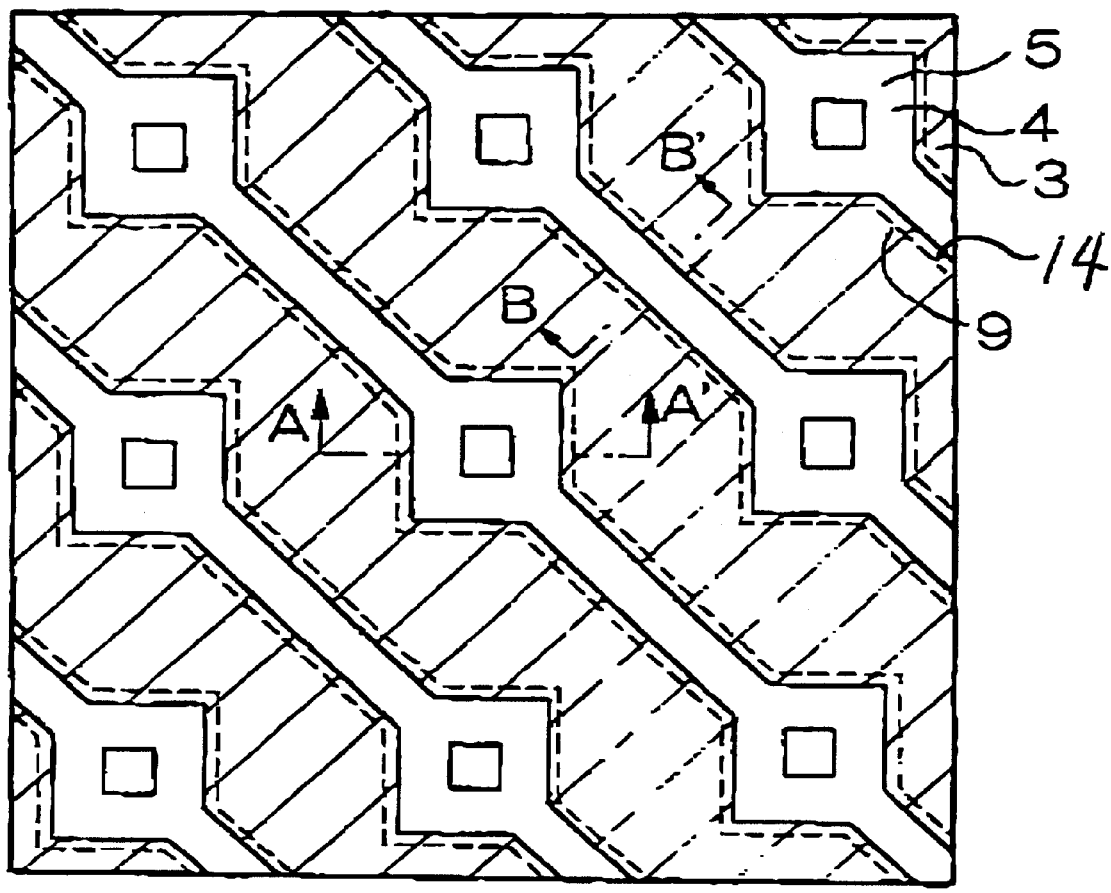
FIG. 4A is a fragmentary plane view illustrative of a third conventional two-dimensional array of a plurality of double diffused MOS field effect transistors over a semiconductor substrate.
Figure 4B:
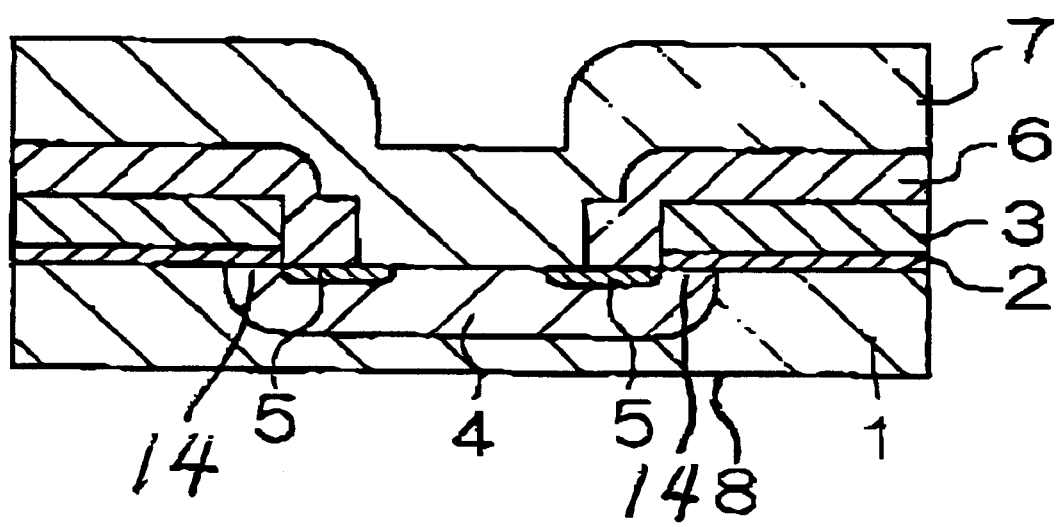
FIG. 4B is a fragmentary cross sectional elevation view illustrative of a semiconductor device having the third conventional two-dimensional array of a plurality of double diffused MOS field effect transistors, taken along an A–A' line of FIG. 4A.
Figure 4C:
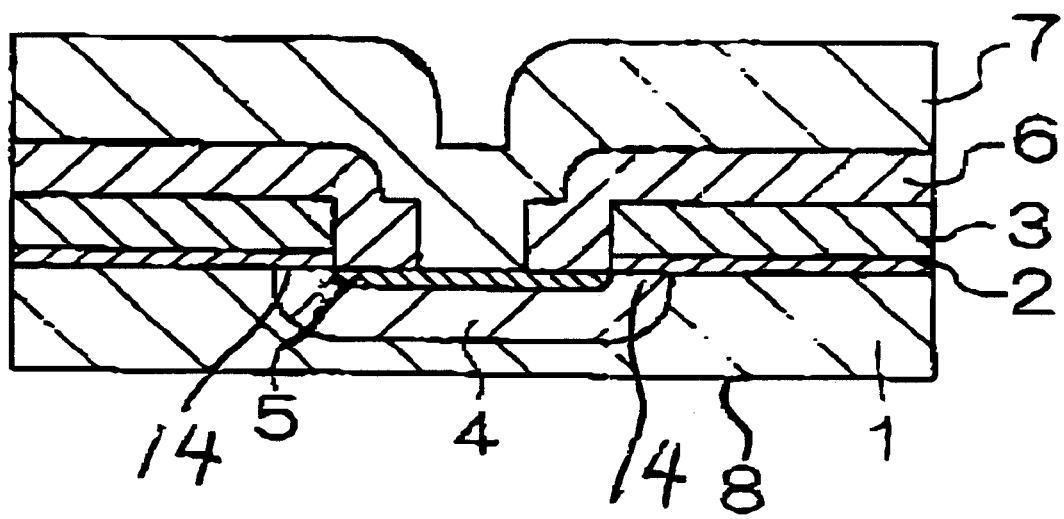
FIG. 4C is a fragmentary cross sectional elevation view illustrative of a semiconductor device having the third conventional two-dimensional array of a plurality of double diffused MOS field effect transistors, taken along a B–B' line of FIG. 4A.
Figure 5:
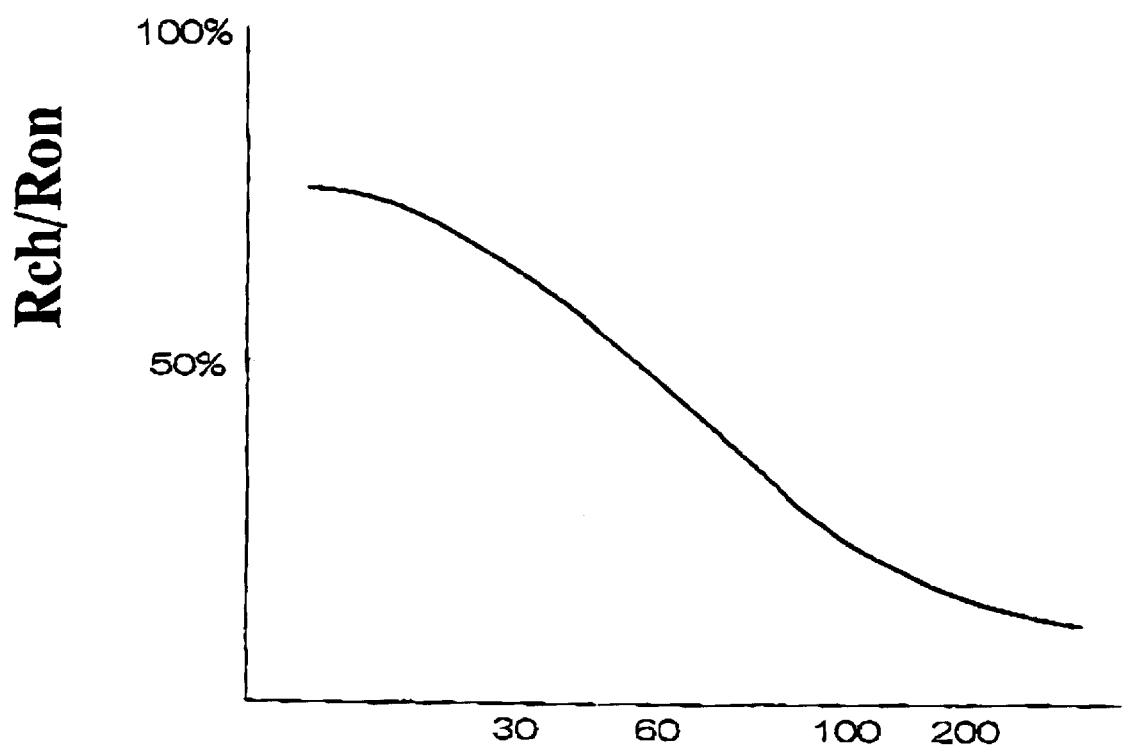
FIG. 5 is a diagram illustrative of variations in ratio of a channel resistance to an ON-resistance over a source-drain withstand voltage of the double diffused MOS field effect transistor.
Figure 6:
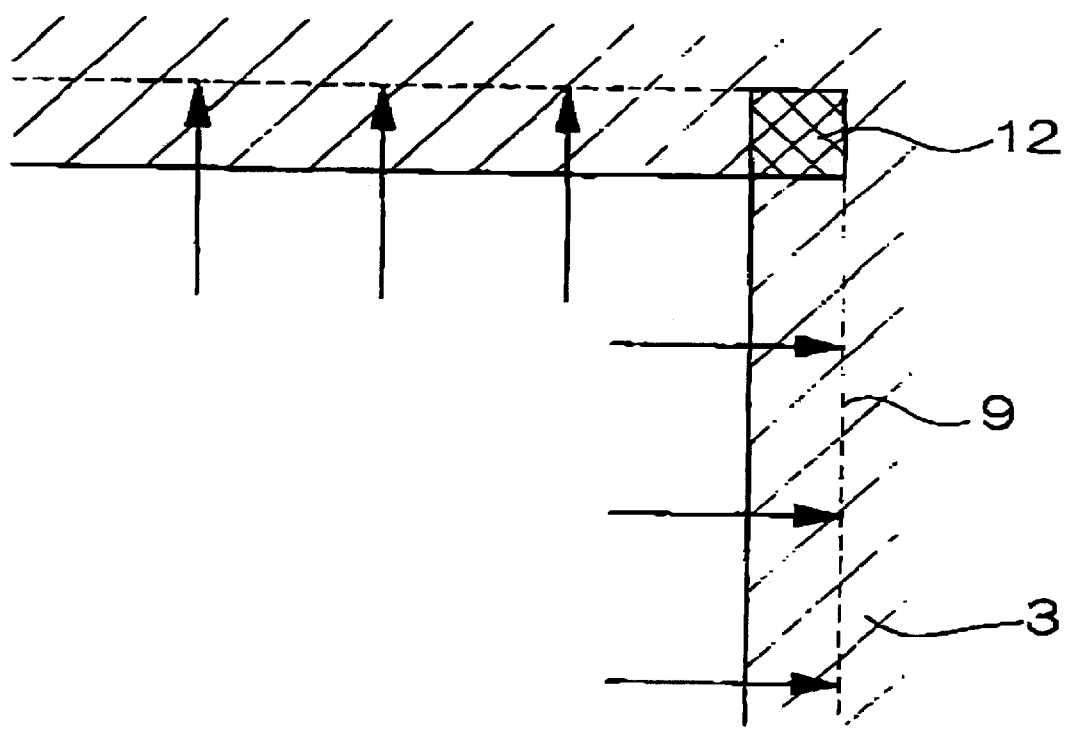
FIG. 6 is a partial enlarged plane view illustrative of a corner of the square-shaped double diffused MOS field effect transistor cell, where the acceptor concentration of the p-type base region in the vicinity of the corner of the square-shaped double diffused MOS field effect transistor cell is lower than the other portions of the p-type base region.
Figure 7A:
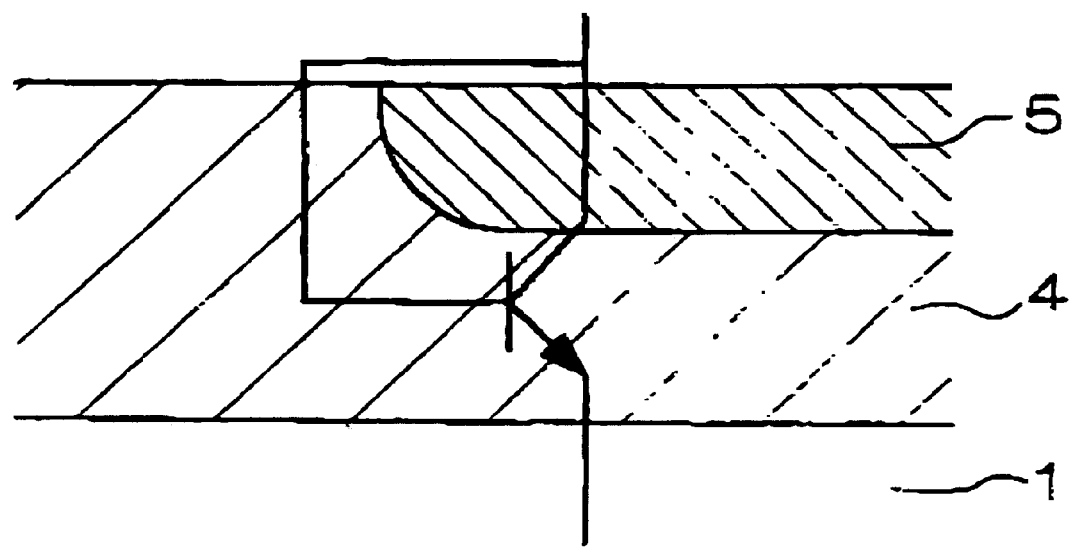
FIG. 7A is a schematic view illustrative of a parasitic transistor as formed at a center portion of the square-shaped expanding portion of the modified band shaped double diffused MOS field effect transistor cell in FIG. 4B.
Figure 7B:
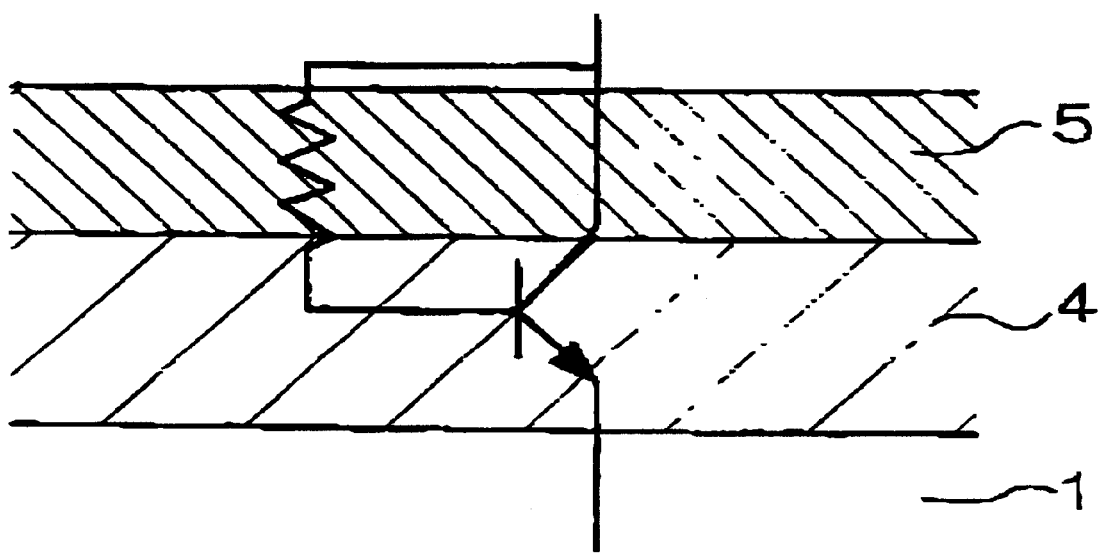
FIG. 7B is a schematic view illustrative of a parasitic transistor as formed at a center portion of the diagonally extending straight band portion of the modified band shaped double diffused MOS field effect transistor cell in FIG. 4C.

The first present invention provides a semiconductor device having a plurality of double diffused field effect transistor cells so aligned in two-dimension that each of at least a majority of the double diffused field effect transistor cells has plural sides bounded with plural channel regions and plural corners free of any bound with the plural channel regions.

It is preferable that the double diffused field effect transistor cells have a polygonal shape.

It is further preferable that all of the double diffused field effect transistor cells have a quadrilateral shape and all of the double diffused field effect transistor cells are aligned in checked pattern so that base diffusion regions of adjacent two of the double diffused field effect transistor cells are connected with each other at a position of the corner so that no channel region extends at the corners.

It is further more preferable that the quadrilateral shape is square.

It is still further preferable that the semiconductor device has a plurality of gate electrodes extending in a diagonal line direction of square of the double diffused field effect transistor cells, and each of the gate electrodes has narrowed portions at the corners of the double diffused field effect transistor cells, and also wherein each of the gate electrodes comprises an impurity doped polysilicon layer, and the narrowed portions of each of the gate electrodes have a higher impurity concentration than remaining portions of the gate electrodes.

It is moreover preferable that each of the gate electrodes further comprises a metal layer laminated over the impurity doped polysilicon layer It is also preferable that the corner comprises an included angle between two straight lines of adjacent two of the sides.

It is also preferable that the corner comprises a circular arc connecting two straight lines of adjacent two of the sides, provided that a radius is sufficiently smaller than lengths of the two straight lines of adjacent two of the sides.

The second present invention provides a two-dimensional alignment of a plurality of double diffused field effect transistor cells over a semiconductor substrate, wherein each of at least a majority of the double diffused field effect transistor cells has plural sides bounded with plural channel regions and plural corners free of any bound with the plural channel regions.

It is preferable that the double diffused field effect transistor cells have a polygonal shape It is further preferable that all of the double diffused field effect transistor cells have a quadrilateral shape and all of the double diffused field effect transistor cells are aligned in checked pattern so that base diffusion regions of adjacent two of the double diffused field effect transistor cells are connected with each other at a position of the corner so that no channel region extends at the corners.

It is further more preferable that the quadrilateral shape is square.

It is still further preferable that the semiconductor device has a plurality of gate electrodes extending in a diagonal line direction of square of the double diffused field effect transistor cells, and each of the gate electrodes has narrowed portions at the corners of the double diffused field effect transistor cells, and also wherein each of the gate electrodes comprises an impurity doped polysilicon layer, and the narrowed portions of each of the gate electrodes have a higher impurity concentration than remaining portions of the gate electrodes.

It is further more preferable that each of the gate electrodes further comprises a metal layer laminated over the impurity doped polysilicon layer.

It is also preferable that the corner comprises an included angle between two straight lines of adjacent two of the sides.

It is also preferable that the corner comprises a circular arc connecting two straight lines of adjacent two of the sides, provided that a radius is sufficiently smaller than lengths of the two straight lines of adjacent two of the sides.

The third present invention provides a semiconductor device having a plurality of double diffused field effect transistor cells square-shaped and aligned in checked pattern so that base diffusion regions of adjacent two of the double diffused field effect transistor cells are connected with each other at a position of the corner so that each of the double diffused field effect transistor cells has four sides bounded with plural channel regions and four corners free of any bound with the plural channel regions.

It is preferable that the semiconductor device has a plurality of gate electrodes extending in a diagonal line direction of square of the double diffused field effect transistor cells, and each of the gate electrodes has narrowed portions at the corners of the double diffused field effect transistor cells, and also wherein each of the gate electrodes comprises an impurity doped polysilicon layer, and the narrowed portions of each of the gate electrodes have a higher impurity concentration than remaining portions of the gate electrodes.

It is further preferable that each of the gate electrodes further comprises a metal layer laminated over the impurity doped polysilicon layer.

The fourth present invention provides a two-dimensional alignment of a plurality of double diffused field effect transistor cells over a semiconductor substrate, wherein the double diffused field effect transistor cells are square-shaped and aligned in checked pattern so that base diffusion regions of adjacent two of the double diffused field effect transistor cells are connected with each other at a position of the corner so that each of the double diffused field effect transistor cells has four sides bounded with plural channel regions and four corners free of any bound with the plural channel regions It is further preferable that the semiconductor device has a plurality of gate electrodes extending in a diagonal line direction of square of the double diffused field effect transistor cells, and each of the gate electrodes has narrowed portions at the corners of the double diffused field effect transistor cells, and also wherein each of the gate electrodes comprises an impurity doped polysilicon layer, and the narrowed portions of each of the gate electrodes have a higher impurity concentration than remaining portions of the gate electrodes It is further more preferable that each of the gate electrodes further comprises a metal layer laminated over the impurity doped polysilicon layer.

The fifth present invention provides a method of layout in a two-dimensional alignment of a plurality of double diffused field effect transistor cells over a cell region, in consideration of both increase in a total width of channel regions of the double diffused field effect transistor cells per a unit area and prevention of the channel regions from extending over any corners of the double diffused field effect transistor cells, whereby the layout is carried out so that each of at least a majority of the double diffused field effect transistor cells has plural sides bounded with plural channel regions and plural corners free of any bound with the plural channel regions.

It is preferable that the double diffused field effect transistor cells have a polygonal shape.

It is further preferable that all of the double diffused field effect transistor cells have a quadrilateral shape and all of the double diffused field effect transistor cells are aligned in checked pattern so that base diffusion regions of adjacent two of the double diffused field effect transistor cells are connected with each other at a position of the corner so that no channel region extends at the corners.

It is further preferable that the quadrilateral shape is square.

The sixth present invention provides a method of optimization to a two-dimensional alignment of a plurality of double diffused field effect transistor cells over a cell region, in consideration of both increase in a total width of channel regions of the double diffused field effect transistor cells per a unit area and prevention of the channel regions from extending over any corners of the double diffused field effect transistor cells, whereby the optimization is carried out so that the double diffused field effect transistor cells are square-shaped and aligned in checked pattern so that base diffusion regions of adjacent two of the double diffused field effect transistor cells are connected with each other at a position of the corner so that each of the double diffused field effect transistor cells has four sides bounded with plural channel regions and four corners free of any bound with the plural channel regions.

PREFERRED EMBODIMENTS

First Embodiment

Figure 8A:
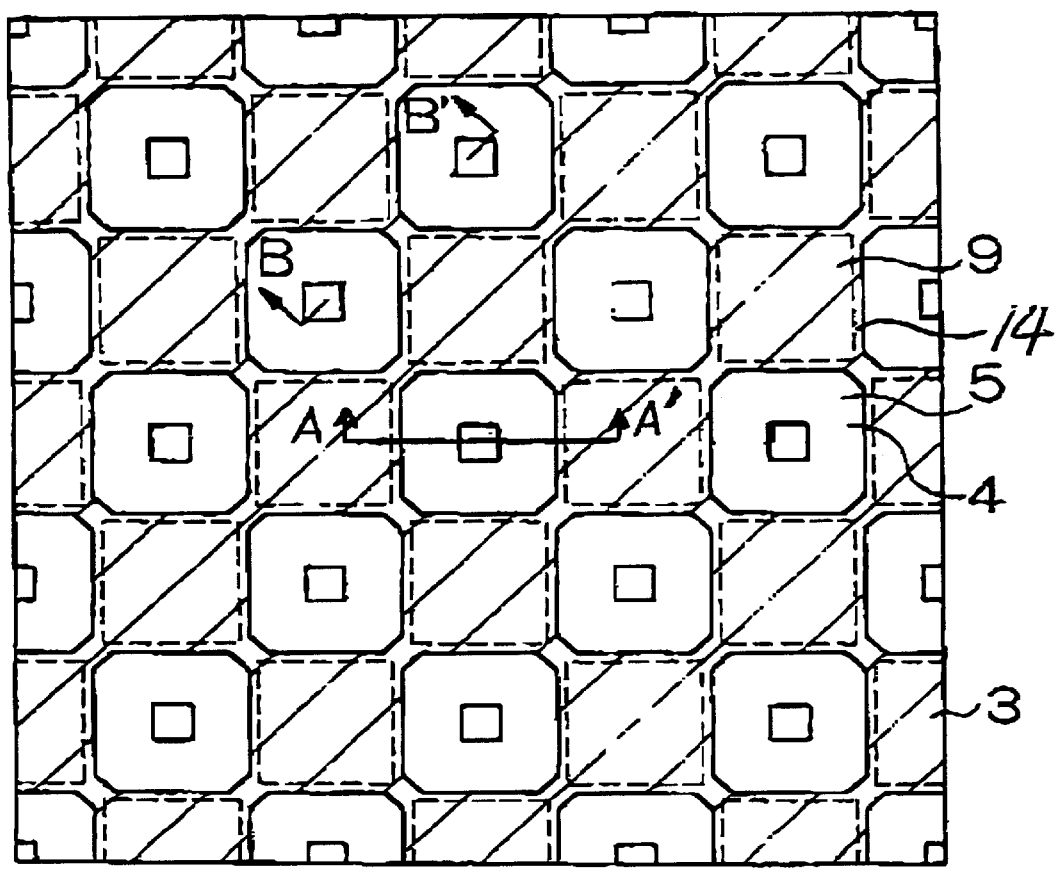
FIG. 8A is a fragmentary plane view illustrative of a first novel two-dimensional checkered array of a plurality of double diffused MOS field effect transistors over a semiconductor substrate in a first embodiment in accordance with the present invention.
Figure 8B:
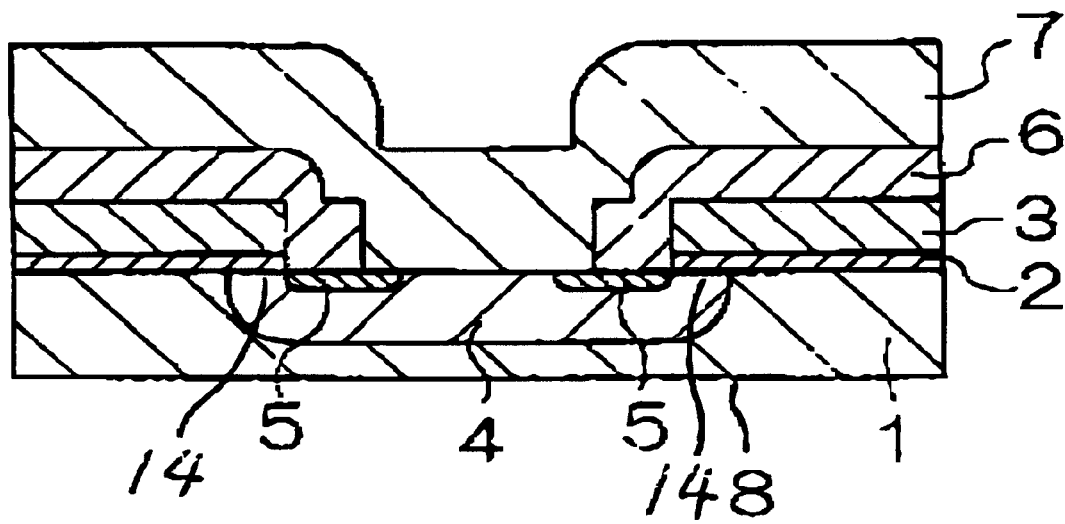
FIG. 8B is a fragmentary cross sectional elevation view illustrative of a semiconductor device having the first novel two-dimensional checkered array of a plurality of double diffused MOS field effect transistors, taken along an A–A' line of FIG. 8A.
Figure 8C:
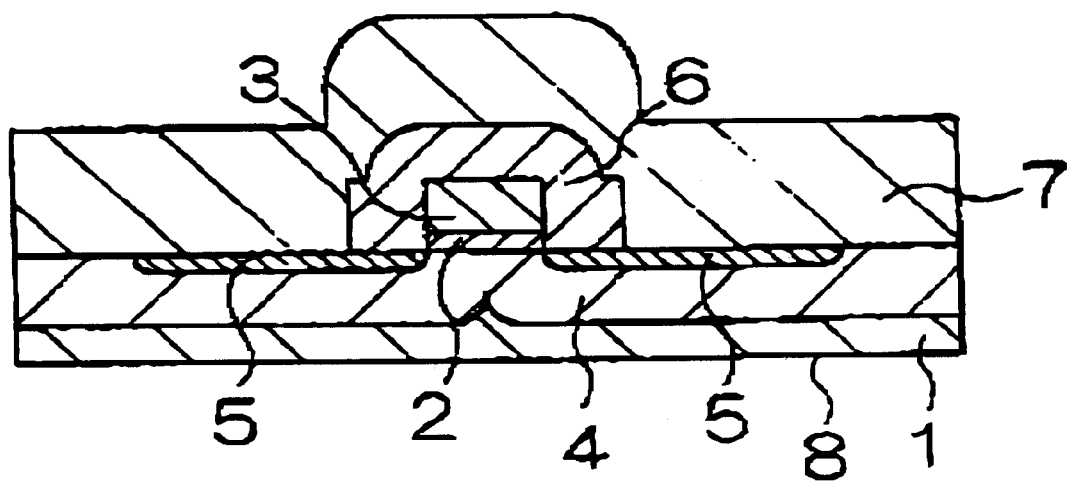
FIG. 8C is a fragmentary cross sectional elevation view illustrative of a semiconductor device having the first novel two-dimensional checkered array of a plurality of double diffused MOS field effect transistors, taken along a B–B' line of FIG. 8A.

A first embodiment according to the present invention will be described in detail with reference to FIGS. 8A, 8B and 8C. FIG. 8A is a fragmentary plane view illustrative of a first novel two-dimensional checkered array of a plurality of double diffused MOS field effect transistors over a semiconductor substrate in a first embodiment in accordance with the present invention. FIG. 8B is a fragmentary cross sectional elevation view illustrative of a semiconductor device having the first novel two-dimensional checkered array of a plurality of double diffused MOS field effect transistors, taken along an A–A' line of FIG. 8A. FIG. 8C is a fragmentary cross sectional elevation view illustrative of a semiconductor device having the first novel two-dimensional checkered array of a plurality of double diffused MOS field effect transistors, taken along a B–B' line of FIG. 8A.

With reference to FIG. 8A, a plurality of square-shaped double diffused MOS field effect transistor cells are aligned in check, wherein the shape of each of the square-shaped double diffused MOS field effect transistor cells is defined by a boundary real line between outside edges of a source region 5 and channel regions 14. Each of the square-shaped double diffused MOS field effect transistor cells comprises four sides bounded with four straight line shaped channel regions 14 and four corners not bounded with any channel region. Each of the four corners of each of the square-shaped double diffused MOS field effect transistor cells is connected through no channel region with a corner of the adjacent square-shaped double diffused MOS field effect transistor cell. A square-shaped boundary broken line 9 corresponds or the outside edge of the base region 4. Adjacent two of the square-shaped double diffused MOS field effect transistor cells are in contact with each other corner to corner, where no channel region is formed.

With reference to FIG. 8B, a p-type base regions 4 is selectively formed in a selected upper region of a n-type semiconductor substrate 1. n+-type source regions 5 are selectively formed in selected upper regions of the p-type base region 4. The straight line shaped channel regions 14 extend between the outside edges of the n+-type source regions 5 and the outside edge of the p-type base region 4. The gate oxide film 2 is selectively formed on the n-type semiconductor substrate 1 and on the straight line shaped channel regions 14. A phosphorus doped polysilicon gate electrode 3 is provided on the gate oxide film 2. An inter-layer insulator 6 is provided, which covers the phosphorus doped polysilicon gate electrode 3 and outside half regions of the n+-type source regions 5. An aluminum electrode layer 7 is provided, which entirely extends over the inter-layer insulator 6 and inside half regions of the n+-type source regions 5. A drain electrode 8 is provided on the bottom surface of the n-type semiconductor substrate 1.

With reference to FIG. 8C, the p-type base regions 4 are, continuously formed in an upper region of the n-type semiconductor substrate 1 to form no channel region. Namely, at a position in the vicinity of adjacent corners of adjacent two of the double diffused MOS field effect transistor cells, the p-type base regions 4 of the adjacent two of the double diffused MOS field effect transistors are connected with each other so as to form no channel region. In the meantime, n+-type source regions 5 are selectively formed in selected upper regions of the continuously formed adjacent two p-type base regions 4 of the adjacent two of the double diffused MOS field effect transistor cells. The gate oxide film 2 is selectively formed on an upper surface of the continuously formed adjacent two p-type base regions 4, wherein the upper region is between the adjacent two of the n+-type source regions 5, whereby no channel region is formed under the gate oxide film 2. The phosphorus doped polysilicon gate electrode 3 is provided on the gate oxide film 2 so that no channel region is formed under the phosphorus doped polysilicon gate electrode 3. The inter-layer insulator 6 is provided, which covers the phosphorus doped polysilicon gate electrode 3 and inside portions of the n+-type source regions 5. An aluminum electrode layer 7 is provided, which entirely extends over the inter-layer insulator 6, the p-type base regions 4 and the n+-type source regions 5 except for the inside portions thereof. A drain electrode 8 is provided on the bottom surface of the n-type semiconductor substrate 1.

The most important properties of the double diffused MOS field effect transistor are a possible reduced ON-resistance, a possible reduced threshold voltage and a possible increased source-drain withstand voltage. The ON-resistance is given by the sum of a channel resistance and a bulk resistance. In the low channel resistance region, the channel resistance is more dominative than the bulk resistance. In the low channel resistance region, therefore, it is more important how to reduce the channel resistance as many as possible in order to reduce the ON-resistance. The channel resistance of the double diffused MOS field effect transistor is inversely proportional to the channel width of the channel region. This means that in order to reduce the channel resistance, it is required to increase the channel width. The channel resistance of the double diffused MOS field effect transistor is also decreased by decreasing the threshold voltage of the double diffused MOS field effect transistor. In order to reduce the channel resistance, it is required to decrease the threshold voltage of the double diffused MOS field effect transistor. The threshold voltage of the double diffused MOS field effect transistor is decreased by decreasing the acceptor or donor concentration of the channel region. The decrease in the acceptor or donor concentration of the base region results in the decreases in threshold voltage and ON-resistance of the double diffused MOS field effect transistor. In order to realize possible reductions in threshold voltage and ON-resistance of the double diffused MOS field effect transistor, it is required to reduce the acceptor or donor concentration of the base region without causing a punch through phenomenon.

The first novel two-dimensional array of a plurality of double diffused MOS field effect transistors illustrated in FIG. 8A has the following advantages. The square-shaped double diffused MOS field effect transistor cells are aligned in checked two-dimensional pattern so that adjacent two of the square-shaped double diffused MOS field effect transistor cells are connected each other through corners, for which reason a density of the square-shaped double diffused MOS field effect transistor cells is high. This high density of the square-shaped double diffused MOS field effect transistor cells means that it is easy to increase a total width of the channel widths of the channel regions in a unit area of the semiconductor substrate. The increased total width of the channel widths of the channel regions in a unit area results in a reduction in channel resistance, whereby the ON-resistance is also reduced.

Further, the acceptor concentration of the p-type base region in the vicinity of the adjacent two corners of the adjacent two square-shaped double diffused MOS field effect transistor cells is lower than the other portions of the p-type base region. Since, however, no channel region is formed in the vicinity of the corners of the square-shaped double diffused MOS field effect transistor cells, no punch through phenomenon appears, thereby no drop of the source-drain withstand voltage. It is unnecessary to increase the acceptor concentration of the base region because no drop of the source-drain withstand voltage nor punch through phenomenon appear by no formation of any channel region in the vicinity of the adjacent two corners of the adjacent two square-shaped double diffused MOS field effect transistor cells. No increase in the acceptor concentration of the base region makes it easy to reduce the threshold voltage, whereby the reduction of the threshold voltage makes the ON-resistance reduced of the double diffused MOS field effect transistor.

Furthermore, the square-shape of the circular-shape double diffused MOS field effect transistor cells provides a largest individual channel width of each of the double diffused MOS field effect transistor cells. This square-shape of the square-shaped double diffused MOS field effect transistor cells increases a total width of the channel widths of the channel regions in a unit area of the semiconductor substrate. The increase in the total width of the channel widths of the channel regions of the square-shaped double diffused MOS field effect transistors reduces the channel resistance of the square-shaped double diffused MOS field effect transistors. The reduction of the channel resistance of the square-shaped double diffused MOS field effect transistors means it possible to reduce the ON-resistance of the double diffused MOS field effect transistor.

Moreover, the square-shaped double diffused MOS field effect transistor cell has no such slender portion as difficult to form a short circuit to prevent any parasitic bipolar transistor from being activated. Namely, the square-shaped double diffused MOS field effect transistor cell allows a short circuit to be formed between the source region 5 and the base region 4.

In order to evaluate the properties of the above novel semiconductor device having optimized two-dimensional arrays of double diffused MOS field effect transistor cells, the first, second and third conventional two-dimensional arrays and the novel checkered two-dimensional array are compared to each other under the same design rule.

Figure 11A:
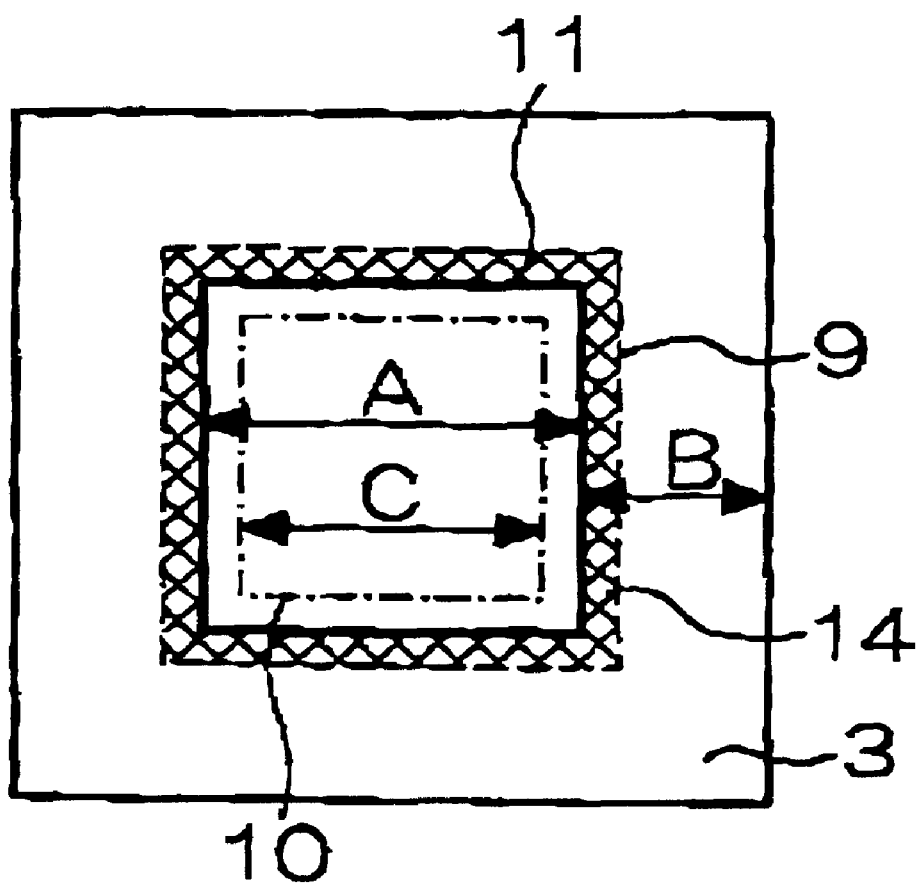
FIG. 11A is a plane view illustrative of the first conventional double diffused MOS field effect transistor cell as a first comparative example.

FIG. 11A is a plane view illustrative of the first conventional double diffused MOS field effect transistor cell as a first comparative example, wherein A is the length of the straight line shaped channel region extending along each side of the square-shaped double diffused MOS field effect transistor cells, B is the width of the polysilicon gate electrode 3 defined between adjacent two of the square-shaped double diffused MOS field effect transistor cells, C is the size of the contact hole. The design is made under the conditions that A=6 micrometers, B=3 micrometers, C=4 micrometers.

Figure 11B:
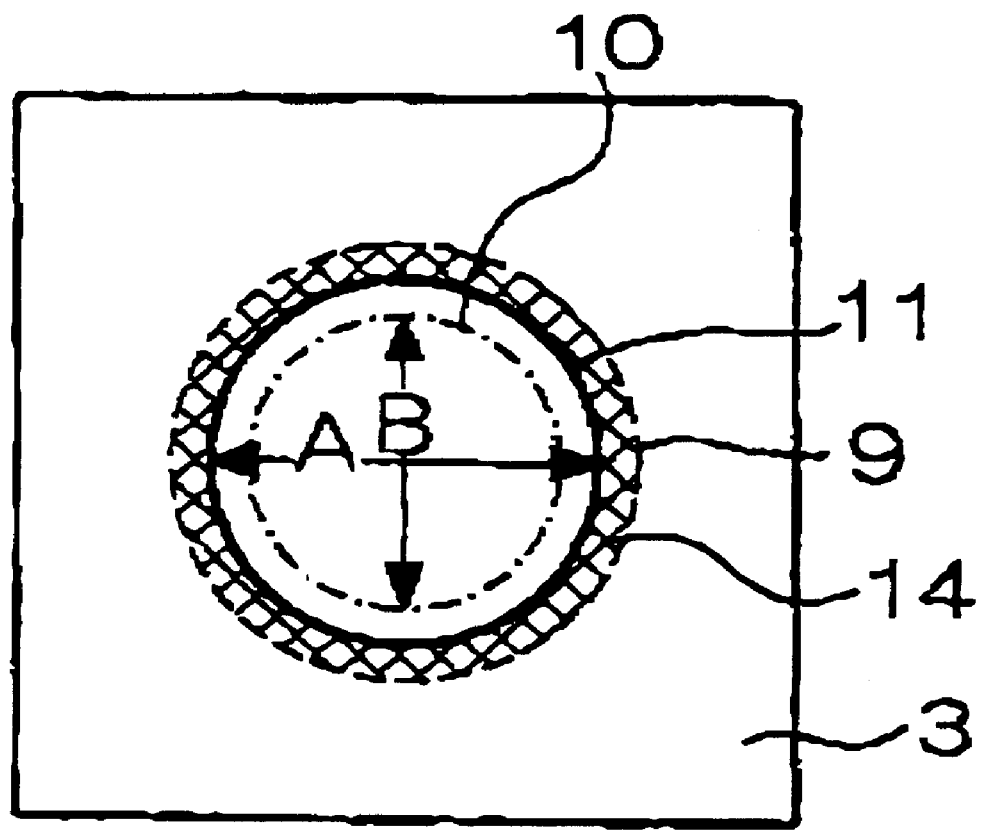
FIG. 11B is a plane view illustrative of the second conventional double diffused MOS field effect transistor cell as a second comparative example.

FIG. 11B is a plane view illustrative of the second conventional double diffused MOS field effect transistor cell as a second comparative example, wherein A is the length of the straight line shaped channel region extending along each side of the square-shaped double diffused MOS field effect transistor cells, C is the size of the contact hole. The design is made under the conditions that A=6 micrometers, C=4 micrometers.

Figure 11C:
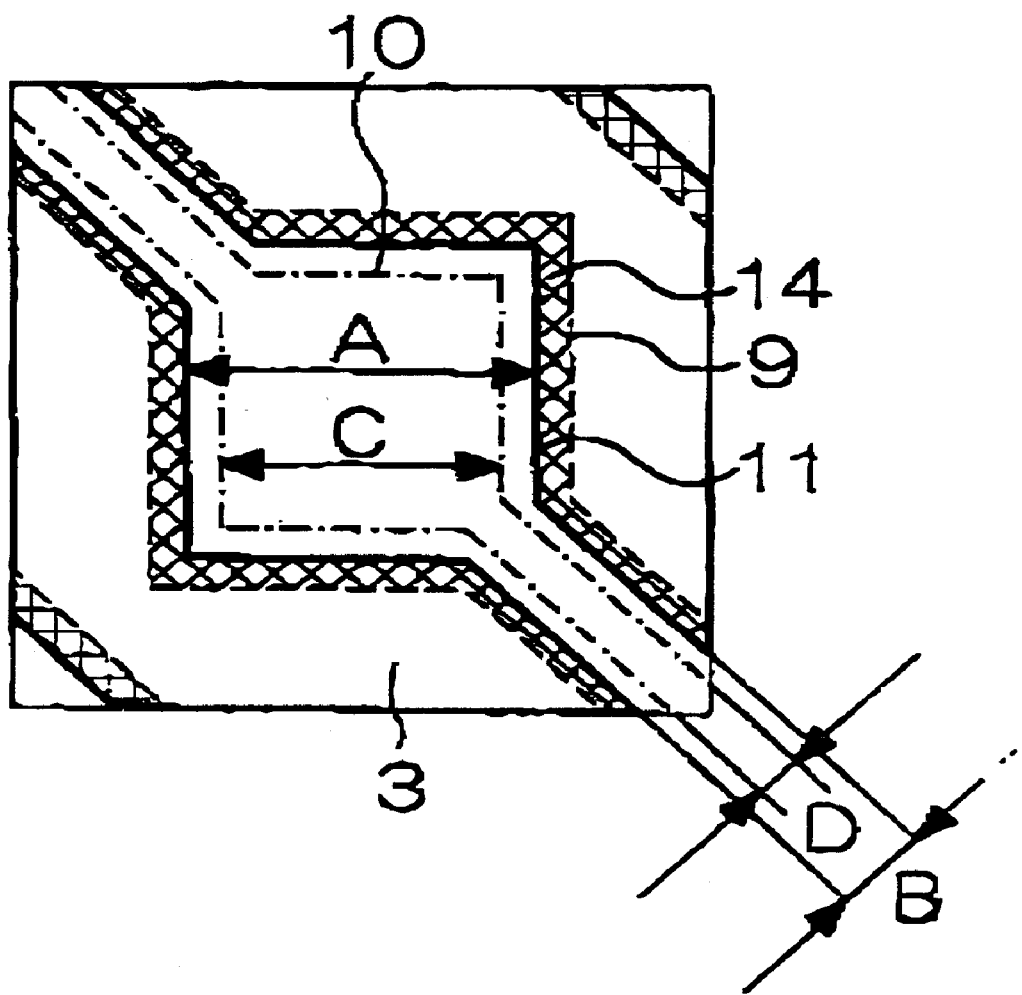
FIG. 11C is a plane view illustrative of the third conventional double diffused MOS field effect transistor cell as a third comparative example.

FIG. 11C is a plane view illustrative of the third conventional double diffused MOS field effect transistor cell as a third comparative example, wherein A is the length of the straight line shaped channel region extending along each side of the square-shaped double diffused MOS field effect transistor cells, B is the width of the polysilicon gate electrode 3 defined between adjacent two of the square-shaped double diffused MOS field effect transistor cells, C is the size of the contact hole formed in the square-shaped expending portion of the modified band shaped double diffused MOS field effcct transistor cell, D is the size of the contact hole formed in the diagonally extending band portion of the modified band shaped double diffused MOS field effect transistor cell. The design is made under the conditions that A=6 micrometers, B=3 micrometers, C=4 micrometers, D=1.5 micrometers.

Figure 11D:
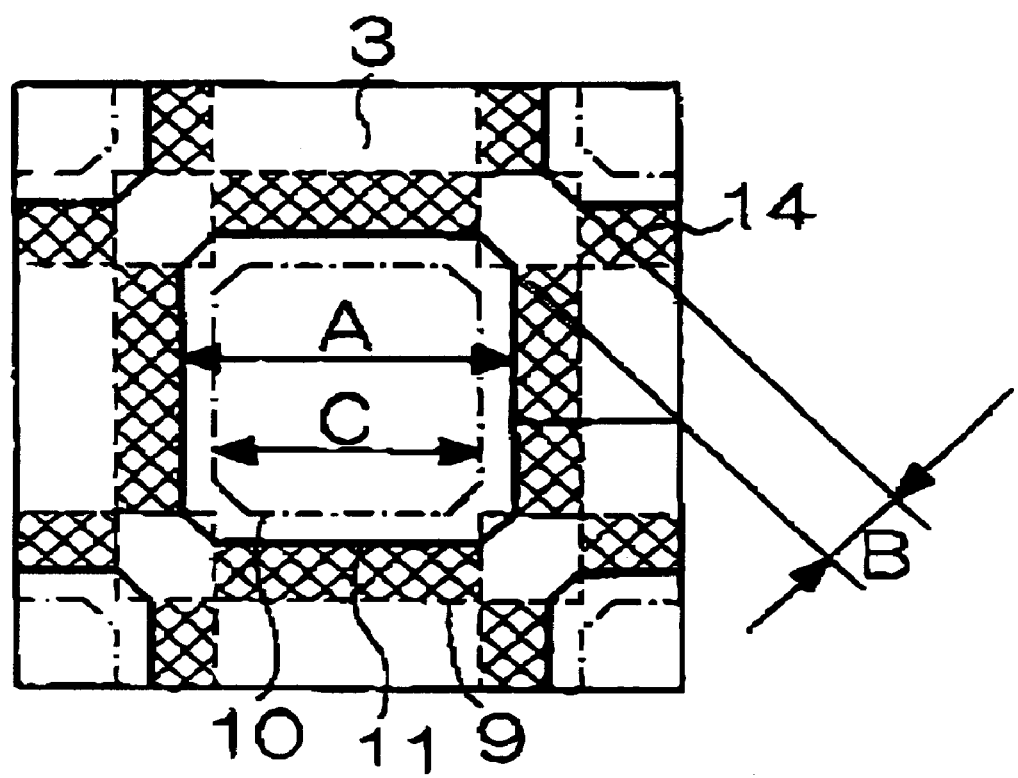
FIG. 11D is a plane view illustrative of the first novel double diffused MOS field effect transistor cell in this first embodiment in accordance with the present invention.

FIG. 11D is a plane view illustrative of the first novel double diffused MOS field effect transistor cell in this first embodiment in accordance with the present invention, wherein A is the length of the straight line shaped channel region extending along each side of the square-shaped double diffused MOS field effect transistor cells, B is the width of the polysilicon gate electrode 3 defined between adjacent two corners of the adjacent two of the square-shaped double diffused MOS field effect transistor cells, C is the size of the contact hole. The design is made under the conditions that A=6 micrometers, B=3 micrometers, C=4 micrometers. No channel region is formed under the polysilicon gate electrode 3 defined between adjacent two corners of the adjacent two of the square-shaped double diffused MOS field effect transistor cells.

The following Table 1 shows a channel width of a single cell, an occupied area of the single cell and a total width of channel regions per a unit area of the novel two-dimensional checkered array of the square-shaped double diffused MOS field effect transistor cells in accordance with the present invention as compared to the first, second and third conventional two-dimensional arrays of the double diffused MOS field effect transistor cells.

TABLE 1

|  | 1st prior art | 2nd prior art | 3rd prior art | invention |
| --- | --- | --- | --- | --- |
| width/a cell | 1 | 0.79 | 1.40 | 0.65 |
| occupied area | 1 | 0.866 | 1.00 | 0.5 |
| width/a unit area | 1 | 0.91 | 1.40 | 1.30 |
| density | very low | low | low | high |
| channel resistance | high | high | low | very low |
| withstand voltage | low | high | low | high |
| parasitic transistor | inactivated | inactivated | activated | inactivated |

Second Embodiment

Figure 9A:
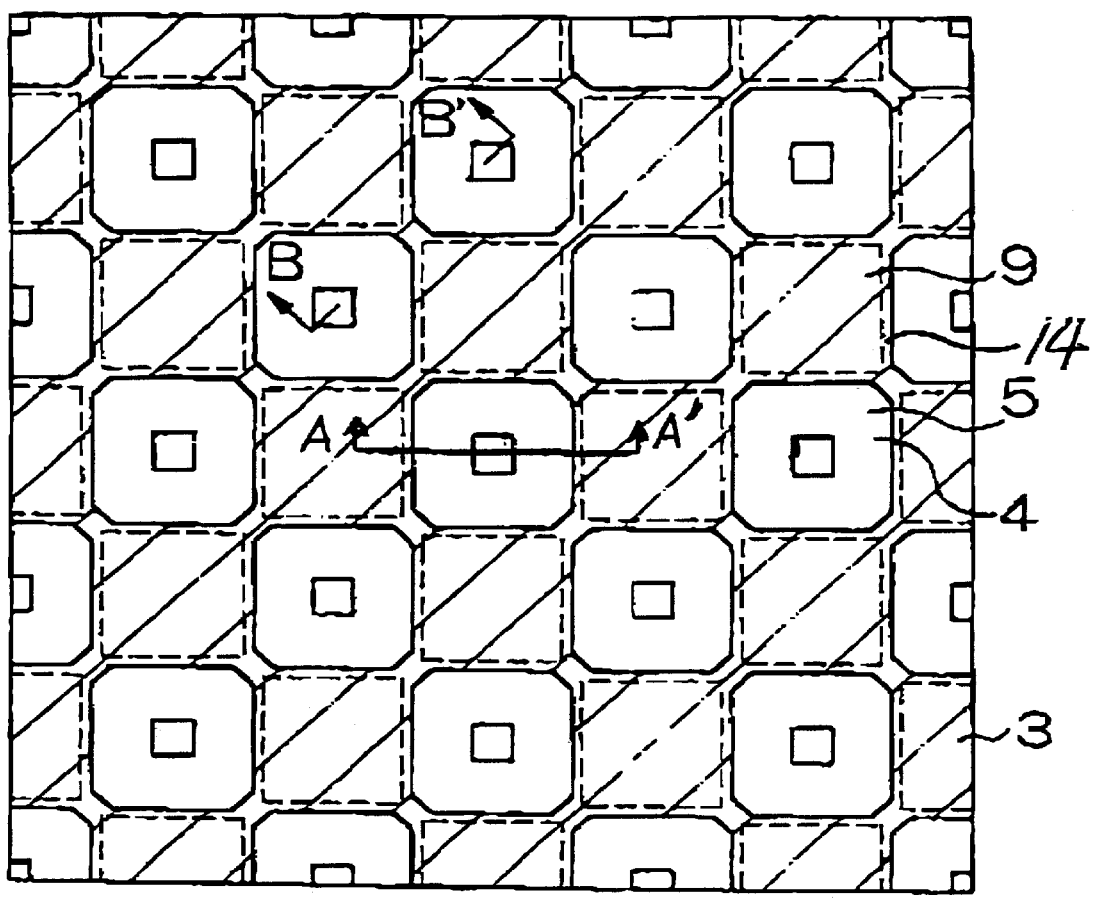
FIG. 9A is a fragmentary plane view illustrative of a second novel two-dimensional checkered array of a plurality of double diffused MOS field effect transistors over a semiconductor substrate in a first embodiment in accordance with the present invention.
Figure 9B:
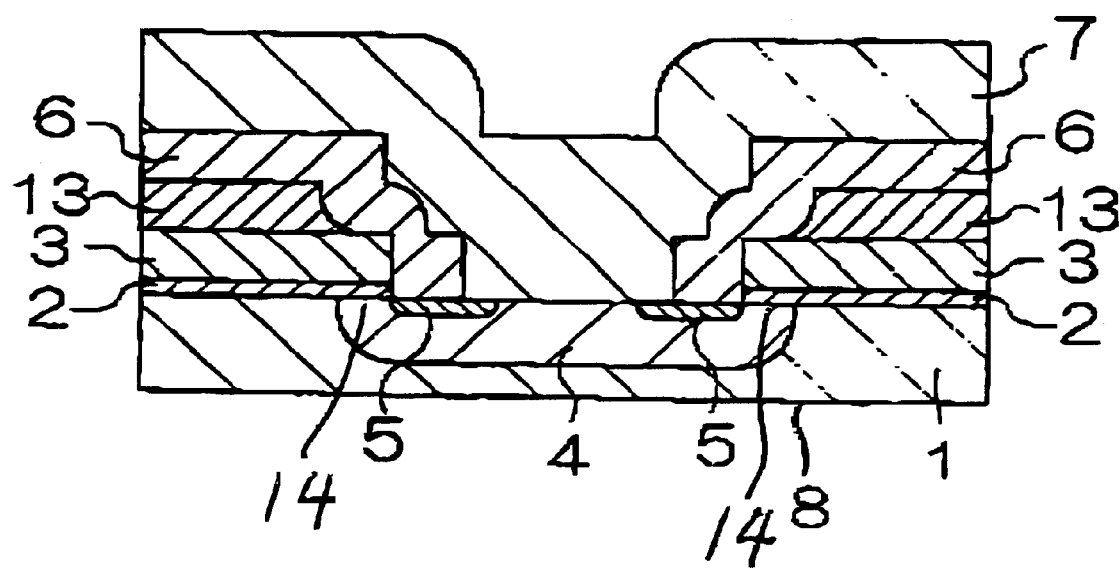
FIG. 9B is a fragmentary cross sectional elevation view illustrative of a semiconductor device having the second novel two-dimensional checkered array of a plurality of double diffused MOS field effect transistors, taken along an A–A' line of FIG. 9A.

A second embodiment according to the present invention will be described in detail with reference to FIGS. 9A and 9B. FIG. 9A is a fragmentary plane view illustrative of a second novel two-dimensional checkered array of a plurality of double diffused MOS field effect transistors over a semiconductor substrate in a first embodiment in accordance with the present invention. FIG. 9B is a fragmentary cross sectional elevation view illustrative of a semiconductor device having the second novel two-dimensional checkered array of a plurality of double diffused MOS field effect transistors, taken along an A–A' line of FIG. 9A. A difference of the second embodiment from the first embodiment is only further providing a laminated structure of a metal layer and a impurity doped polysilicon layer for a gate electrode in order to reduce the resistance of the gate electrode for allowing a high speed switching performance of the square-shaped double diffused MOS field effect transistor cells.

With reference to FIG. 9A, a plurality of square-shaped double diffused MOS field effect transistor cells are aligned in check, wherein the shape of each of the square-shaped double diffused MOS field effect transistor cells is defined by a boundary real line between outside edges of a source region 5 and channel regions 14. Each of the square-shaped double diffused MOS field effect transistor cells comprises four sides bounded with four straight line shaped channel regions 14 and four corners not bounded with any channel region. Each of the four corners of each of the square-shaped double diffused MOS field effect transistor cells is connected through no channel region with a corner of the adjacent square-shaped double diffused MOS field effect transistor cell. A square-shaped boundary broken line 9 corresponds or the outside edge of the base region 4. Adjacent two of the square-shaped double diffused MOS field effect transistor cells are in contact with each other corner to corner, where no channel region is formed.

With reference to FIG. 9B, a p-type base regions 4 is selectively formed in a selected upper region of a n-type semiconductor substrate 1. n+-type source regions 5 are selectively formed in selected upper regions of the p-type base region 4. The straight line shaped channel regions 14 extend between the outside edges of the n+-type source regions 5 and the outside edge of the p-type base region 4. The gate oxide film 2 is selectively formed on the n-type semiconductor substrate 1 and on the straight line shaped channel regions 14. A gate electrode is provided on the gate oxide film 2. This gate electrode comprises laminations of a phosphorus doped polysilicon gate electrode lower layer 3 provided on the gate oxide film 2 and a tungsten silicide gate electrode upper layer 13 laminated on the phosphorus doped polysilicon gate electrode lower layer 3. The tungsten silicide gate electrode upper layer 13 has a lower resistivity than the phosphorus doped polysilicon gate electrode lower layer 3. An inter-layer insulator 6 is provided, which covers the tungsten silicide gate electrode upper layer 13 and outside half regions of the n+-type source regions 5. An aluminum electrode layer 7 is provided, which entirely extends over the inter-layer insulator 6 and inside half regions of the n+-type source regions 5. A drain electrode 8 is provided on the bottom surface of the n-type semiconductor substrate 1.

The most important properties of the double diffused MOS field effect transistor are a possible reduced ON-resistance, a possible reduced threshold voltage and a possible increased source-drain withstand voltage. The ON-resistance is given by the sum of a channel resistance and a bulk resistance In the low channel resistance region, the channel resistance is more dominative than the bulk resistance. In the low channel resistance region, therefore, it is more important how to reduce the channel resistance as many as possible in order to reduce the ON-resistance. The channel resistance of the double diffused MOS field effect transistor is inversely proportional to the channel width of the channel region. This means that in order to reduce the channel resistance, it is required to increase the channel width. The channel resistance of the double diffused MOS field effect transistor is also decreased by decreasing the threshold voltage of the double diffused MOS field effect transistor. In order to reduce the channel resistance, it is required to decrease the threshold voltage of the double diffused MOS field effcct transistor. The threshold voltage of the double diffused MOS field effect transistor is decreased by decreasing the acceptor or donor concentration of the channel region. The decrease in the acceptor or donor concentration of the base region results in the decreases in threshold voltage and ON-resistance of the double diffused MOS field effect transistor. In order to realize possible reductions in threshold voltage and ON-resistance of the double diffused MOS field effect transistor, it is required to reduce the acceptor or donor concentration of the base region without causing a punch through phenomenon.

The second novel two-dimensional array of a plurality of double diffused MOS field effect transistors illustrated in FIG. 8A has the following advantages.

The provision of the tungsten silicide gate electrode upper layer 13 having a lower resistivity than the phosphorus doped polysilicon gate electrode lower layer 3 results in decrease the gate resistance whereby the high speed switching performance is further improved.

Further, the square-shaped double diffused MOS field effect transistor cells are aligned in checked two-dimensional pattern so that adjacent two of the square-shaped double diffused MOS field effect transistor cells are connected each other through corners, for which reason a density of the square-shaped double diffused MOS field effect transistor cells is high. This high density of the square-shaped double diffused MOS field effect transistor cells means that it is easy to increase a total width of the channel widths of the channel regions in a unit area of the semiconductor substrate. The increased total width of the channel widths of the channel regions in a unit area results in a reduction in channel resistance, whereby the ON-resistance is also reduced.

Still further, the acceptor concentration of the p-type base region in the vicinity of the adjacent two corners of the adjacent two square-shaped double diffused MOS field effect transistor cells is lower than the other portions of the p-type base region. Since, however, no channel region is formed in the vicinity of the corners of the square-shaped double diffused MOS field effect transistor cells, no punch through phenomenon appears, thereby no drop of the source-drain withstand voltage. It is unnecessary to increase the acceptor concentration of the base region because no drop of the source-drain withstand voltage nor punch through phenomenon appear by no formation of any channel region in the vicinity of the adjacent two corners of the adjacent two square-shaped double diffused MOS field effect transistor cells. No increase in the acceptor concentration of the base region makes it easy to reduce the threshold voltage, whereby the reduction of the threshold voltage makes the ON-resistance reduced of the double diffused MOS field effect transistor.

Furthermore, the square-shape of the circular-shape double diffused MOS field effect transistor cells provides a largest individual channel width of each of the double diffused MOS field effect transistor cells. This square-shape of the square-shaped double diffused MOS field effect transistor cells increases a total width of the channel widths of the channel regions in a unit area of the semiconductor substrate. The increase in the total width of the channel widths of the channel regions of the square-shaped double diffused MOS field effect transistors reduces the channel resistance of the square-shaped double diffused MOS field effect transistors. The reduction of the channel resistance of the square-shaped double diffused MOS field effect transistors means it possible to reduce the ON-resistance of the double diffused MOS field effect transistor.

Moreover, the square-shaped double diffused MOS field effect transistor cell has no such slender portion as difficult to form a short circuit to prevent any parasitic bipolar transistor from being activated, Namely, the square-shaped double diffused MOS field effect transistor cell allows a short circuit to be formed between the source region 5 and the base region 4.

Third Embodiment

Figure 10A:
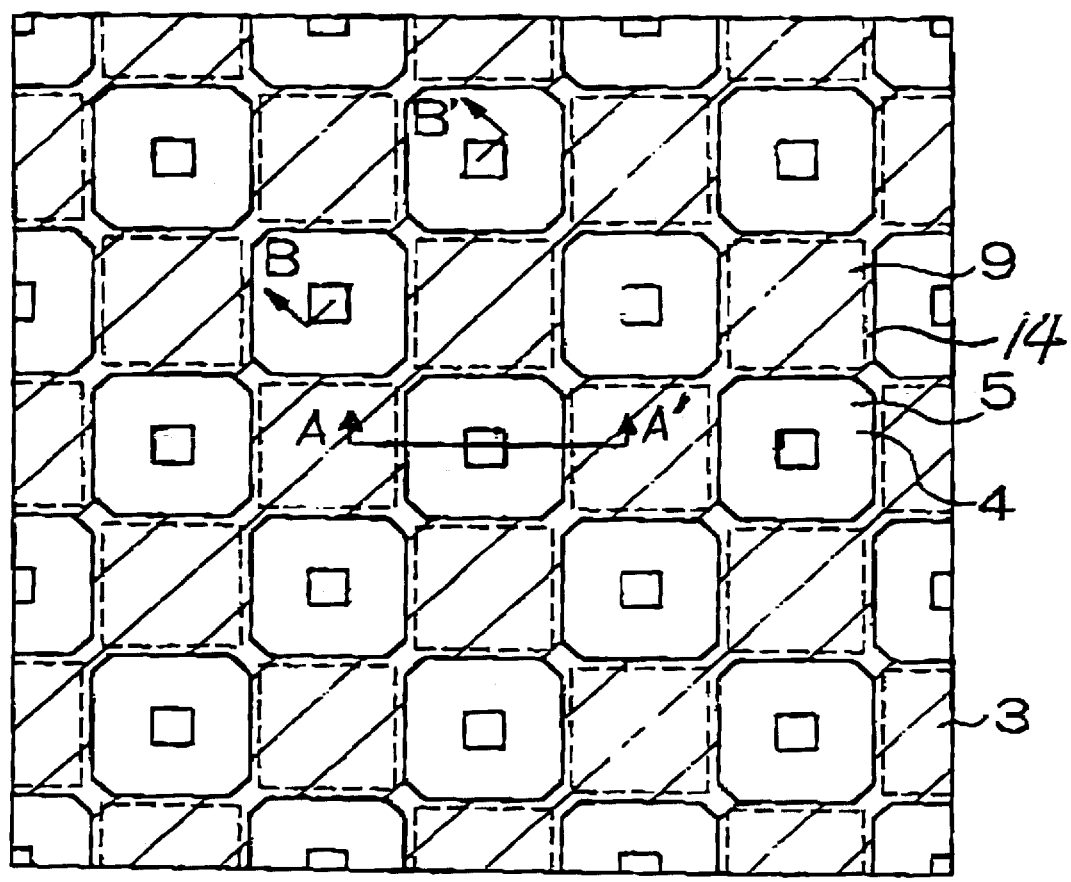
FIG. 10A is a fragmentary plane view illustrative of a third novel two-dimensional checkered array of a plurality of double diffused MOS field effect transistors over a semiconductor substrate in a third embodiment in accordance with the present invention.
Figure 10B:
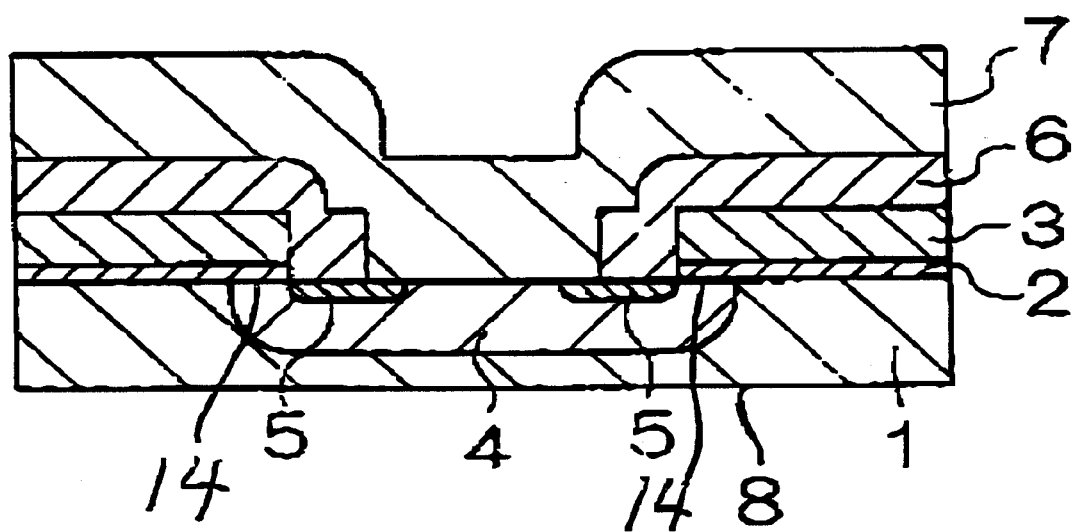
FIG. 10B is a fragmentary cross sectional elevation view illustrative of a semiconductor device having the third novel two-dimensional checkered array of a plurality of double diffused MOS field effect transistors, taken along an A–A' line of FIG. 10A.
Figure 10C:
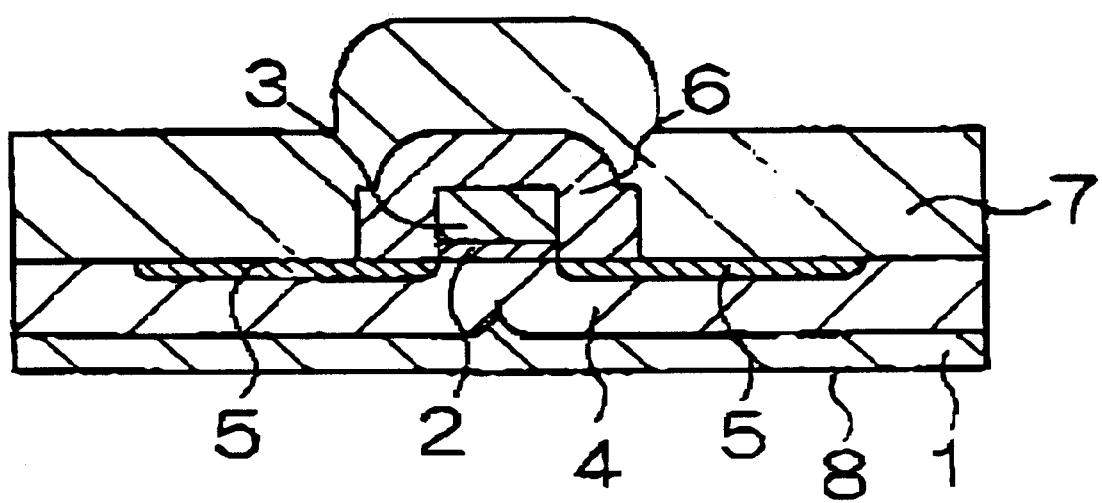
FIG. 10C is a fragmentary cross sectional elevation view illustrative of a semiconductor device having the third novel two-dimensional checkered array of a plurality of double diffused MOS field effect transistors, taken along a B–B' line of FIG. 10A.

A third embodiment according to the present invention will be described in detail with reference to FIGS. 10A, 10B and 10C. FIG. 10A is a fragmentary plane view illustrative of a third novel two-dimensional checkered array of a plurality of double diffused MOS field effect transistors over a semiconductor substrate in a third embodiment in accordance with the present invention. FIG. 10B is a fragmentary cross sectional elevation view illustrative of a semiconductor device having the third novel two-dimensional checkered array of a plurality of double diffused MOS field effect transistors, taken along an A–A' line of FIG. 10A FIG. 10C is a fragmentary cross sectional elevation view illustrative of a semiconductor device having the third novel two-dimensional checkered array of a plurality of double diffused MOS field effect transistors, taken along a B–B' line of FIG. 10A. A difference of the third embodiment from the first embodiment is only increased impurity concentration of narrowed portions of the gate electrodes between adjacent two corners of the adjacent two square-shaped double diffused MOS field effect transistor cells in order to reduce the resistance of the gate electrode for allowing a high speed switching performance of the square-shaped double diffused MOS field effect transistor cells.

With reference to FIG. 10A, a plurality of square-shaped double diffused MOS field effect transistor cells are aligned in check, wherein the shape of each of the square-shaped double diffused MOS field effect transistor cells is defined by a boundary real line between outside edges of a source region 5 and channel regions 14. Each of the square-shaped double diffused MOS field effect transistor cells comprises four sides bounded with four straight line shaped channel regions 14 and four corners not bounded with any channel region. Each of the four corners of each of the square-shaped double diffused MOS field effect transistor cells is connected through no channel region with a corner of the adjacent square-shaped double diffused MOS field effect transistor cell. A square-shaped boundary broken line 9 corresponds or the outside edge of the base region 4. Adjacent two of the square-shaped double diffused MOS field effect transistor cells are in contact with each other corner to corner, where no channel region is formed.

With reference to FIG. 10B, a p-type base regions 4 is selectively formed in a selected upper region of a n-type semiconductor substrate 1. n+-type source regions 5 are selectively formed in selected upper regions of the p-type base region 4. The straight line shaped channel regions 14 extend between the outside edges of the n+-type source regions 5 and the outside edge of the p-type base region 4. The gate oxide film 2 is selectively formed on the n-type semiconductor substrate 1 and on the straight line shaped channel regions 14. A phosphorus doped polysilicon gate electrode 3 is provided on the gate oxide film 2. An inter-layer insulator 6 is provided, which covers the phosphorus doped polysilicon gate electrode 3 and outside half regions of the n+-type source regions 5. An aluminum electrode layer 7 is provided, which entirely extends over the inter-layer insulator 6 and inside half regions of the n+-type source regions 5. A drain electrode 8 is provided on the bottom surface of the n-type semiconductor substrate 1.

With reference to FIG. 10C, the p-type base regions 4 are continuously formed in an upper region of the n-type semiconductor substrate 1 to form no channel region. Namely, at a position in the vicinity of adjacent corners of adjacent two of the double diffused MOS field effect transistor cells, the p-type base regions 4 of the adjacent two of the double diffused MOS field effect transistors are connected with each other so as to form no channel region. In the meantime, n+-type source regions 5 are selectively formed in selected upper regions of the continuously formed adjacent two p-type base regions 4 of the adjacent two of the double diffused MOS field effect transistor cells. The gate oxide film 2 is selectively formed on an upper surface of the continuously formed adjacent two p-type base regions 4, wherein the upper region is between the adjacent two of the n+-type source regions a, whereby no channel region is formed under the gate oxide film 2. The phosphorus doped polysilicon gate electrode 3 is provided on the gate oxide film 2 so that no channel region is formed under the phosphorus doped polysilicon gate electrode 3. The impurity concentration of the narrowed portions of the gate electrodes 3 between adjacent two corners of the adjacent two square-shaped double diffused MOS field effect transistor cells may be increased to $1E19-1E20$ $cm^{-3}$ in order to reduce the resistance of the gate electrode for allowing a high speed switching performance of the square-shaped double diffused MOS field effect transistor cells. The inter-layer insulator 6 is provided, which covers the phosphorus doped polysilicon gate electrode 3 and inside portions of the n+-type source regions 5. An aluminum electrode layer 7 is provided, which entirely extends over the inter-layer insulator 6, the p-type base regions 4 and the n+-type source regions 5 except for the inside portions thereof. A drain electrode 8 is provided on the bottom surface of the n-type semiconductor substrate 1.

The most important properties of the double diffused MOS field effect transistor are a possible reduced ON-resistance, a possible reduced threshold voltage and a possible increased source-drain withstand voltage. The ON-resistance is given by the sum of a channel resistance and a bulk resistance. In the low channel resistance region, the channel resistance is more dominative than the bulk resistance. In the low channel resistance region, therefore, it is more important how to reduce the channel resistance as many as possible in order to reduce the ON-resistance. The channel resistance of the double diffused MOS field effect transistor is inversely proportional to the channel width of the channel region. This means that in order to reduce the channel resistance, it is required to increase the channel width. The channel resistance of the double diffused MOS field effect transistor is also decreased by decreasing the threshold voltage of the double diffused MOS field effect transistor. In order to reduce the channel resistance, it is required to decrease the threshold voltage of the double diffused MOS field effect transistor. The threshold voltage of the double diffused MOS field effect transistor is decreased by decreasing the acceptor or donor concentration of the channel region. The decrease in the acceptor or donor concentration of the base region results in the decreases in threshold voltage and ON-resistance of the double diffused MOS field effect transistor. In order to realize possible reductions in threshold voltage and ON-resistance of the double diffused MOS field effect transistor, it is required to reduce the acceptor or donor concentration of the base region without causing a punch through phenomenon The first novel two-dimensional array of a plurality of double diffused MOS field effect transistors illustrated in FIG. 10A has the following advantages.

The increased impurity concentration of narrowed portions of the gate electrodes between adjacent two corners of the adjacent two square-shaped double diffused MOS field effect transistor cells in order to reduce the resistance of the gate electrode for allowing a high speed switching performance of the square-shaped double diffused MOS field effect transistor cells.

Further, the square-shaped double diffused MOS field effect transistor cells are aligned in checked two-dimensional pattern so that adjacent two of the square-shaped double diffused MOS field effect transistor cells are connected each other through corners, for which reason a density of the square-shaped double diffused MOS field effect transistor cells is high. This high density of the square-shaped double diffused MOS field effect transistor cells means that it is easy to increase a total width of the channel widths of the channel regions in a unit area of the semiconductor substrate. The increased total width of the channel widths of the channel regions in a unit area results in a reduction in channel resistance, whereby the ON-resistance is also reduced.

Still further, the acceptor concentration of the p-type base region in the vicinity of the adjacent two corners of the adjacent two square-shaped double diffused MOS field effect transistor cells is lower than the other portions of the p-type base region. Since, however, no channel region is formed in the vicinity of the corners of the square-shaped double diffused MOS field effect transistor cells, no punch through phenomenon appears, thereby no drop of the source-drain withstand voltage. It is unnecessary to increase the acceptor concentration of the base region because no drop of the source-drain withstand voltage nor punch through phenomenon appear by no formation of any channel region in the vicinity of the adjacent two corners of the adjacent two square-shaped double diffused MOS field effect transistor cells. No increase in the acceptor concentration of the base region makes it easy to reduce the threshold voltage, whereby the reduction of the threshold voltage makes the ON-resistance reduced of the double diffused MOS field effect transistor.

Furthermore, the square-shape of the circular-shape double diffused MOS field effect transistor cells provides a largest individual channel width of each of the double diffused MOS field effect transistor cells. This square-shape of the square-shaped double diffused MOS field effect transistor cells increases a total width of the channel widths of the channel regions in a unit area of the semiconductor substrate. The increase in the total width of the channel widths of the channel regions of the square-shaped double diffused MOS field effect transistors reduces the channel resistance of the square-shaped double diffused MOS field effect transistors. The reduction of the channel resistance of the square-shaped double diffused MOS field effect transistors means it possible to reduce the ON-resistance of the double diffused MOS field effect transistor.

Moreover, the square-shaped double diffused MOS field effect transistor cell has no such slender portion as difficult to form a short circuit to prevent any parasitic bipolar transistor from being activated. Namely, the square-shaped double diffused MOS field effect transistor cell allows a short circuit to be formed between the source region 5 and the base region 4.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device having a plurality of double diffused field effect transistor cells so aligned in two-dimension that each of at least a majority of said double diffused field effect transistor cells has plural sides bounded with plural channel regions and plural corners free of any bound with said plural channel regions, wherein said double diffused field effect transistor cells have a polygonal shape, all of said double diffused field effect transistor cells have a quadrilateral shape and all of said double diffused field effect transistor cells are aligned in checked pattern so that base diffusion regions of adjacent two of said double diffused field effect transistor cells are connected with each other at a position of said corner so that no channel region extends at said corners, said quadrilateral shape is square, and said semiconductor device has a plurality of gate electrodes extending in a diagonal line direction of square of said double diffused field effect transistor cells, and each of said gate electrodes has narrowed portions at said corners of said double diffused field effect transistor cells, and also wherein each of said gate electrodes comprises an impurity doped polysilicon layer, and said narrowed portions of each of said gate electrodes have a higher impurity concentration than remaining portions of said gate electrodes.

2. The semiconductor device is claimed in claim 1, wherein each of said gate electrodes further comprises a metal layer laminated over said impurity doped polysilicon layer.

3. A semiconductor device having a plurality of double diffused field effect transistor cells so aligned in two-dimension that each of at least a majority of said double diffused field effect transistor cells has plural sides bounded with plural channel regions and plural corners free of any bound with said plural channel regions, wherein said corner comprises a circular arc connecting two straight lines of adjacent two of said sides, a radius of said are being smaller than lengths of said two straight lines.

4. A two-dimensional alignment of a plurality of double diffused field effect transistor cells over a semiconductor substrate, wherein, each of at least a majority of said double diffused field effect transistor cells has plural sides bounded with plural channel regions, and plural corners free of any bound with said plural channel regions, said double diffused field transistor cells have a polygonal shape, all of said double diffused field effect transistor cells have a quadrilateral shape and all of said double diffused field effect transistor cells are aligned in checked pattern so that base diffusion regions of adjacent two of said double diffused field effect transistor cells are connected with each other at a position of said corner so that no channel region extends at said corners, said quadrilateral is square, and said semiconductor device has a plurality of gate electrodes extending in a diagonal line direction of square of said double diffused field effect transistor cells, and each of said gate electrodes has narrowed portions at said corners of said double diffused field effect transistor cells, and also wherein each of said gate electrodes comprises an impurity doped polysilicon layer, and said narrowed portions of each of said gate electrodes have a higher impurity concentration than remaining portions of said gate electrodes.

5. The two-dimensional alignment as claimed in claim 4, wherein each of said gate electrodes further comprises a metal layer laminated over said impurity doped polysilicon layer.

6. A two-dimensional alignment of a plurality of double diffused field effect transistor cells over a semiconductor substrate, wherein each of at least a majority of said double diffused field effect transistor cells has plural sides bounded with plural channel regions and plural corners free of any bound with said plural channel regions and, said corner comprises a circular arc connecting two straight lines of adjacent two of said sides, a radius of said arc being smaller than lengths of said two straight lines.

7. A semiconductor device having a plurality of double diffused field effect transistor cells square-shaped and aligned in checked pattern so that base diffusion regions of adjacent two of said double diffused field effect transistor cells are connected with each other at a position of said corner so that each of said double diffused field effect transistor cells has four sides bounded with plural channel regions and four corners free of any bound with said plural channel regions wherein said semiconductor device has a plurality of gate electrodes extending in a diagonal line direction of square of said double diffused field effect transistor cells, and each of said gate electrodes has narrowed portions at said corners of said double diffused field effect transistor cells, and also wherein each of said gate electrodes comprises an impurity doped polysilicon layer, and said narrowed portions of each of said gate electrodes have a higher impurity concentration than remaining portions of said gate electrodes.

8. The semiconductor device as claimed in claim 7, wherein each of said gate electrodes further comprises a metal layer laminated over said impurity doped polysilicon layer.

9. A two-dimensional alignment of a plurality of double diffused field effect transistor cells over a semiconductor substrate, wherein said double diffused field effect transistor cells are square-shaped and aligned in checked pattern so that base diffusion regions of adjacent two of said double diffused field effect transistor cells are connected with each other at a position of said corner so that each of said double diffused field effect transistor cells has four sides bounded with plural channel regions and four corners free of any bound with said plural channel regions, and said semiconductor device has a plurality of gate electrodes extending in a diagonal line direction of square of said double diffused field effect transistor cells, and each of said gate electrodes has narrowed portions at said corners of said double diffused field effect transistor cells, and also wherein each of said gate electrodes comprises an impurity doped polysilicon layer, and said narrowed portions of each of said gate electrodes have a higher impurity concentration than remaining portions of said gate electrodes.

10. The two-dimensional alignment as claimed in claim 9, wherein each of said electrodes further comprises a metal layer laminated over said impurity doped polysilicon layer.

* * * * *